(12) United States Patent
Hirata et al.

(10) Patent No.: US 6,516,454 B1
(45) Date of Patent: Feb. 4, 2003

(54) METHOD OF ESTIMATING TIME DELAY

(75) Inventors: Masaaki Hirata, Osaka (JP); Ryuichi Yamaguchi, Osaka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 72 days.

(21) Appl. No.: 09/714,101

(22) Filed: Nov. 17, 2000

(30) Foreign Application Priority Data

Nov. 19, 1999 (JP) .......................................... 11-329513

(51) Int. Cl.$^7$ .............................................. G06F 17/50
(52) U.S. Cl. ........................................................ 716/6
(58) Field of Search ............................................. 716/6

(56) References Cited

U.S. PATENT DOCUMENTS

| 5,359,535 A | * | 10/1994 | Djaja et al. .................. 327/261 |
| 6,038,384 A | * | 3/2000 | Ehrler ............................ 716/5 |
| 6,389,381 B1 | * | 5/2002 | Isoda et al. .................... 703/14 |

FOREIGN PATENT DOCUMENTS

| JP | 07-105247 | 4/1995 |
| JP | 08-106485 | 4/1996 |
| JP | 11003366 A | 1/1999 |
| JP | 2000-194732 | 7/2000 |

OTHER PUBLICATIONS

"P2Lib: Process Portable Library and Its Generation System", H. Onodera et al., Design Automation 84–6, May 23, 1997, pp. 37–44.
Masaaki Hirata et al., "A Method of timing Library Generation for Arbitrary Supply Voltages", Technical Report of IEICE. VLD00–123 ICD99–280, vol. 99, No. 656, pp. 49–54 (Mar. 3, 2002).

* cited by examiner

Primary Examiner—Vuthe Siek
Assistant Examiner—Brandon Bowers
(74) Attorney, Agent, or Firm—McDermott, Will & Emery

(57) ABSTRACT

A method of accurately estimating a time delay caused by a target cell where a target supply voltage is applied to the cell. Time delays, caused by a representative cell, are represented as a function of supply voltages applied to the cell, thereby deriving an approximation function k1. An interpolation function k2 is derived from the approximation function k1 by reference to two points P1 and P2. P1 indicates a time delay T1 caused by the target cell where a supply voltage V1 is applied thereto, while P2 indicates a time delay T2 caused by the target cell where a different supply voltage V2 is applied thereto. Thus, the interpolation function k2 represents the time delays caused by the target cell as a function of supply voltages. And by using this interpolation function k2, a time delay caused by the target cell at the target supply voltage can be estimated accurately.

19 Claims, 18 Drawing Sheets

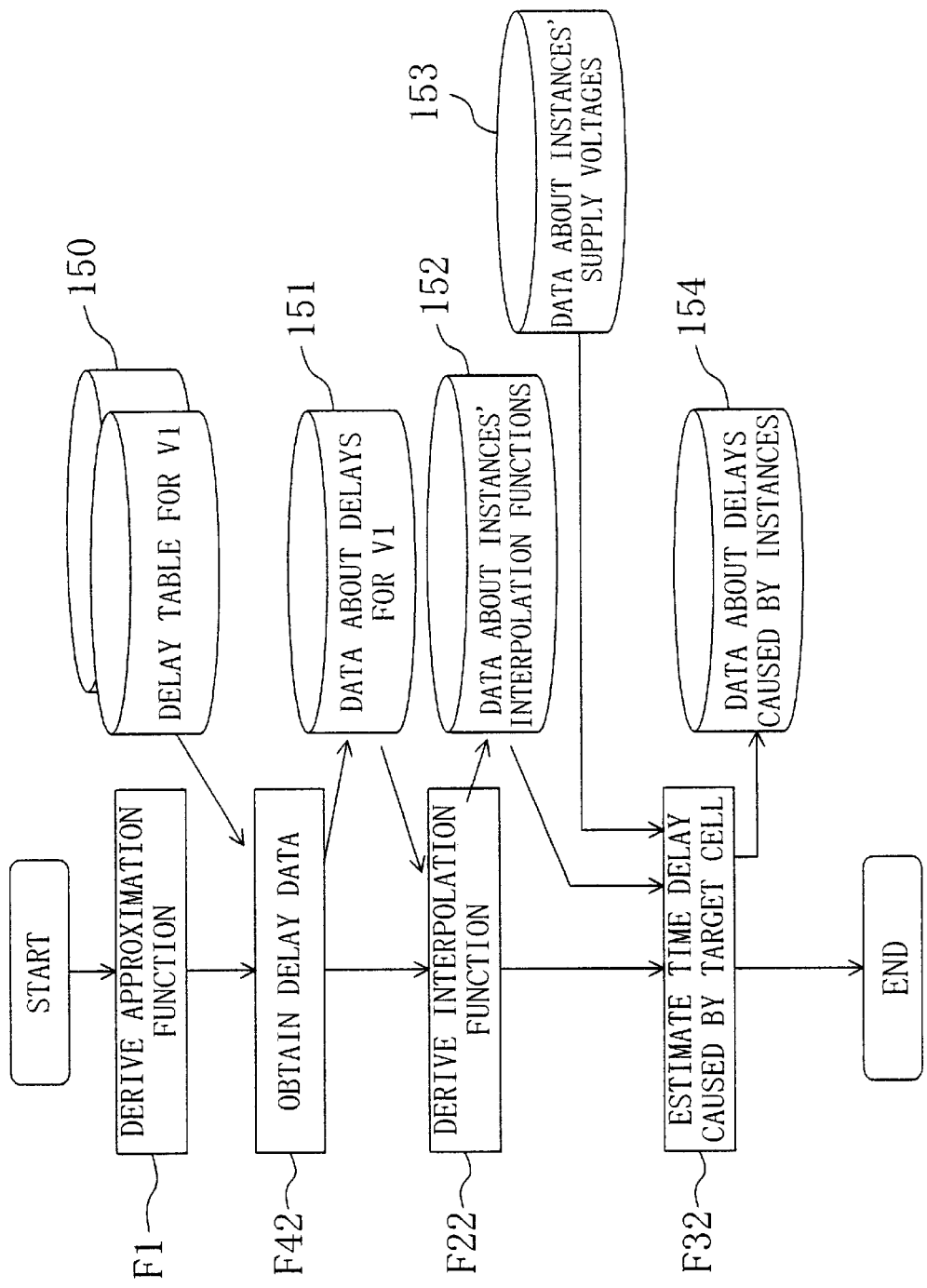

FIG. 14

152 inst1  g(Vdd,Tpd51)=f(Vdd)+Tpd51−Tpd50
inst2  g(Vdd,Tpd52)=f(Vdd)+Tpd52−Tpd50
inst3  g(Vdd,Tpd53)=f(Vdd)+Tpd53−Tpd50
inst4  g(Vdd,Tpd54)=f(Vdd)+Tpd54−Tpd50
inst5  g(Vdd,Tpd55)=f(Vdd)+Tpd55−Tpd50

153 inst1  V001
inst2  V002
inst3  V003
inst4  V004
inst5  V005

⋮

154 inst1   Tpd61
inst2   Tpd62
inst3   Tpd63
inst4   Tpd64
inst5   Tpd65

METHOD OF ESTIMATING TIME DELAY

BACKGROUND OF THE INVENTION

The present invention relates to a method of estimating a time delay caused by one of multiple cells, including logic elements, in a semiconductor integrated circuit.

To reduce the power dissipated by a semiconductor integrated circuit or to increase the operating speed thereof, a supply voltage to be applied to the circuit sometimes needs to be changed selectively. This is because if the supply voltage is changed, then a signal will be propagated through the circuit at a different rate and eventually the power consumed by the circuit will be changeable also. However, once the supply voltage is replaced with a newly selected one, the circuit will cause a different amount of time delay. Thus, it is necessary for the designer of the circuit to know the time delay that will be estimatingly caused by the circuit upon the application of the selected voltage. And then the designer needs to make sure whether or not the circuit still can operate normally even if the circuit should cause the time delay in that estimated amount.

Generally speaking, while a circuit is being laid out, a time delay caused by each of the cells for the circuit can be represented as a function of the transition time of a signal wave input to the cell and the capacitance of a load driven by the cell. The function may be represented by either a table indexed by transition time and load capacitance or an equation that also uses transition time and load capacitance as arguments. Although each of these methods has its own advantages and disadvantages, the former table method is usually preferred because the time delay can be represented much more freely than the other. It should be noted that tables such as those illustrated in FIG. 3 will be herein called "delay tables".

In representing a circuit's time delays as a delay table, if there are two or more supply voltages applicable to the circuit, then the same number of delay tables should be prepared. That is to say, one delay table needs to be provided for each supply voltage. Each of those delay tables can be compiled from time delays, which were measured as representative values for a combination of transition times and load capacitances through circuit simulations. As used herein, the combination of transition times and load capacitances, from which a delay table is compiled, will be called "delay table indices". Accordingly, to newly compile a delay table, the time delays caused by each cell need to be measured by performing simulations on the circuit. Thus, it takes a great deal of man-hour to prepare a delay table for each and every supply voltage to be applied.

A technique of eliminating this problem is proposed in Japanese Laid-Open Publication No. 11-3366, for example. According to the technique, a reference time delay is calculated using a combination of circuit operation conditions, including predefined supply voltage, process variation and temperature, as a reference combination. Next, a coefficient table is prepared. On this table, various time delay coefficients, corresponding to respective combinations of circuit operation conditions (which are determined by multiple combinations of variable elements prepared for the reference time delay), are stored. And by multiplying the reference time delay by a time delay coefficient associated with a given combination of circuit operation conditions, a time delay, which will be caused under the given conditions, is obtained for each cell. In this manner, the technique makes it possible to obtain an estimated time delay associated with a target supply voltage without compiling any new delay table.

However, the present inventors found out based on results of experiments that the variation of time delay against supply voltage is actually not uniform but changeable among respective cells (i.e., depending on the type of a cell in question). For that reason, according to the technique disclosed in the above-identified publication, the time delay estimated almost always contains a certain amount of error, because the same coefficient is applied to each and every cell irrespective of its type. As a result, the time delay associated with the given supply voltage cannot be estimated accurately enough by such a method. And we found that the variation of time delay against supply voltage is changeable among cells because the threshold voltages of the cells are different from each other.

Hereinafter, it will be described with reference to FIGS. 19 and 20 specifically how the difference in threshold voltage of cells affects the time delays of the cells. In FIGS. 19 and 20, IN denotes the waveform of a signal input to a given cell, OUT denotes the waveform of the output signal of the cell, and Vth101 denotes a threshold voltage used as a reference voltage in estimating the time delay. It should be noted that the threshold voltage Vth101 is defined for convenience sake only and is different from the threshold voltage specific to an individual cell. As used herein, the "threshold volt age" of a cell refers to a voltage at which a signal level transition starts to be propagated to the next stage. Accordingly, when cells designed are actually implemented, the threshold voltage is variable among those cells. Also, even in a single cell, if the cell has two or more input terminals, then the threshold voltage is also variable among the input terminals. And the threshold voltage is changeable as well depending on the voltage of signal input. In the known methods, however, the threshold voltage is supposed to be constant due to various constraints involved with a CAD tool. As shown in FIG. 19, the time delay T101 of a cell is herein defined as an interval between the instant the level of the input signal wave IN reaches the threshold voltage Vth101 and the instant the level of the output signal waveform OUT reaches the threshold voltage Vth101. Suppose a signal wave IN11 has been presented to a predetermined input terminal. Then, as shown in FIG. 20, the actual threshold voltage at the input terminal will be Vth112 and Vth113 for supply voltages V1 and V2, respectively. It should be noted that the voltages Vth2 and Vth113 are herein normalized with the supply voltages V1 and V2, respectively. In this case, if the supply voltage has changed from V1 into V, then the threshold voltage will also change from Vth112 into vth113 and the time delay T101 will also change by the lag T114. The time lag T114 only reflects the variation in threshold voltage. Accordingly, the time delay T101 is actually further variable depending on a variation in drivability as well.

As can be seen, the time lag T114 is variable among individual cells or among respective input terminals in a cell. In spite of this fact, if the same combination of circuit operation conditions is applicable, the same coefficient is automatically used for each and every cell according to the known delay estimating method. Thus, such a technique cannot take a variation in delay, resulting from the time lag T114, into account.

FIG. 21 illustrates respective ratios of time delays, resulting from various supply voltages applied to five types of cells, to a reference time delay associated with a reference supply voltage of 2.5 V. As shown in FIG. 21, the supply voltage applied was changed between 1.8 V and 2.7 V at a scale of 0.1 V and the time delays were estimated through circuit simulations. In this case, the cells used were inverter, five-input NAND gate, five-input NOR gate, buffer, five-input AND gate and five-input OR gate. The ratios were also obtained for the rise and fall of the output signal waveform of each cell. As can be seen from FIG. 21, the time delay obviously changes depending on the type of a cell.

FIG. 22 illustrates respective ratios of time delays, caused by an inverter at ten different supply voltages, to a reference time delay associated with a reference supply voltage of 2.5 V. In the example illustrated in FIG. 22, the inverter was operated under nine different combinations of transition times of input signal wave and load capacitances. As shown in FIG. 22, the supply voltage applied was also changed between 1.8 V and 2.7 V at a scale of 0.1 V and the time delays were estimated through circuit simulations. As can be easily seen from FIG. 22, the time delay obviously changes depending on the combination of transition time of the input signal wave and load capacitance.

SUMMARY OF THE INVENTION

It is therefore an object of the present invention to provide a method of accurately estimating a time delay that will be caused by a given cell for a target supply voltage by taking the cell-by-cell variation in time delay against supply voltages.

To achieve this object, according to the present invention, a time delay to be caused by a predetermined cell (i.e., representative cell) is represented in advance as a function of supply voltage. In addition, at least two delay tables, corresponding to mutually different supply voltages, are also prepared for a target cell for which a time delay should eventually be estimated. Then, a function is derived exclusively for the target cell by modifying the former function using the delay tables. And by using the newly derived function, the time delay caused by the target cell at a target supply voltage is estimated.

Also, according to the present invention, a correction value is added to a time delay, which has been obtained simply by multiplying the reference time delay by the same coefficient as in the known methods, so that the delay can be estimated accurately enough for a specific type of cell.

Furthermore, according to the present invention, even if a single delay table has been prepared for just one supply voltage, an interpolation function, representing a relation between the time delays caused by the target cell and the supply voltages, is derived. And in accordance with the interpolation function, the time delays, which will be caused by each of multiple instances, are estimated for the supply voltages applied to the instance by reference to the transition times of a signal input to the instance and the output load capacitances.

Specifically, an inventive delay estimating method is applicable to estimation of a time delay caused by one of multiple cells, including logic elements, in a semiconductor integrated circuit. The method includes the steps of: a) deriving an approximation function; b) deriving an interpolation function; c) compiling a third delay table; and d) estimating the time delay caused by a target cell. First, in the step a), time delays, which correspond to various supply voltages to be applied to a representative one of the cells and which have been obtained in advance through circuit simulations or actual measurement, are read out. Then, a relation between the time delays and the supply voltages applied to the representative cell is derived as the approximation function. Next, in the step b), first and second delay tables, which were prepared in advance for first and second ones of the supply voltages, are consulted as to a target one of the cells, for which a time delay associated with a target one of the supply voltages should be obtained. Then, a relation between the time delays of the target cell and the supply voltages is represented as the interpolation function by reference to the time delays described on the first and second delay tables and the approximation function. Subsequently, in the step c), the third delay table is compiled for a combination of transition times of an input signal wave and output load capacitances in accordance with the interpolation function in a situation where the target supply voltage is applied to the target cell. Finally, in the step d), the time delay to be caused by the target cell at the target sup ply voltage is estimated by searching the third delay table for one of the transition times and one of the output load capacitances that are associated with the target cell.

Another inventive delay estimating method is also applicable to estimation of a time delay caused by one of multiple cells, including logic elements, in a semiconductor integrated circuit. The method includes the steps of: a) deriving an approximation function; b) compiling third and fourth delay tables from first and second tables read out; c) deriving an interpolation function; d) compiling a fifth delay table; and e) estimating the time delay caused by a target cell. First, in the step a), time delays, which correspond to various supply voltages to be applied to a representative one of the cells and which have been obtained in advance through circuit simulations or actual measurement, are read out. Then, a relation between the time delays and the supply voltages applied to the representative cell is derived as the approximation function. In the step b), the first table describes time delays, caused by a target one of the cells, for which a time delay associated with a target one of the supply voltages should be obtained, using a first combination of transition times of an input signal wave and load capacitances in a situation where a first one of the supply voltages is applied to the target cell. The second table describes the time delays, caused by the target cell, using a second combination of transition times of the input signal wave and load capacitances in a situation where a second one of the supply voltages is applied to the target cell. The third and fourth tables describe the time delays caused by the target cell using a third combination, obtained by combining the first and second combinations together, in situations where the first and second supply voltages are applied to the target cell, respectively. Then, in the step c), the interpolation function is derived as a relation between the time delays caused by the target cell and the supply voltages by reference to the time delays described on the third and fourth delay tables and the approximation function. Subsequently, in the step d), the fifth delay table is compiled for the third combination of transition times of the input signal wave and output load capacitances in accordance with the interpolation function in a situation where the target supply voltage is applied to the target cell. Finally, in the step e), the time delay to be caused by the target cell at the target supply voltage is estimated by searching the fifth delay table for one of the transition times and one of the output load capacitances that are associated with the target cell.

In one embodiment of the present invention, the third combination may be obtained in the step b) by deriving a logical sum of the first and second combinations.

In an alternative embodiment, the third combination may also be obtained in the step b) by performing linear interpolation on the first and second combinations.

Still another inventive delay estimating method is also applicable to estimation of a time delay caused by one of multiple cells, including logic elements, in a semiconductor integrated circuit. The method includes the steps of: a) deriving an approximation function; b) calculating first and second time delays; c) deriving an interpolation function; and d) estimating the time delay caused by a target cell. First, in the step a), time delays, which correspond to various supply voltages to be applied to a representative one of the cells and which have been obtained in advance through circuit simulations or actual measurement, are read out. Then, a relation between the time delays and the supply voltages applied to the representative cell is derived as the approximation function. Next, in the step b), the first and second time delays that will be caused by a target one of the cells, for which a time delay associated with a target one of the supply voltages should be obtained, are calculated in situations where first and second ones of the supply voltages are applied to the target cell, respectively. Subsequently, in the step c), the interpolation function is derived as a relation between the time delays of the target cell and the supply voltages by reference to the approximation function and the first and second time delays. Finally, in the step d), the time delay to be caused by the target cell at the target supply voltage is estimated in accordance with the interpolation function.

In one embodiment of the present invention, mutually different approximation functions may be derived in the step of deriving the approximation function for rise and fall of an output signal of the representative cell.

In another embodiment of the present invention, the interpolation function g(Vdd) may be defined in the step of deriving the interpolation function as:

$$g(Vdd)=f(Vdd)*A+B$$

where f(Vdd) is the approximation function and A and B are first and second constants, respectively. The first and second constants A and B may be set to such values as making the interpolation function g(Vdd) equal to a time delay T1 at the first supply voltage and equal to a time delay T2 at the second supply voltage, respectively.

In still another embodiment, if delay tables corresponding to at least three of the supply voltages have been prepared, the inventive method may further include the step of selecting two of the tables, corresponding to two of the voltages that are closest to the target voltage, as the tables for use in the step of deriving the interpolation function.

Yet another inventive delay estimating method is also applicable to estimation of a time delay caused by one of multiple cells, including logic elements, in a semiconductor integrated circuit. The method includes the steps of: a) measuring first, second, third and fourth threshold voltages of a representative one of the cells; b) calculating first and second time delays; and c) estimating a time delay caused by a target cell. In the step a), the first threshold voltage has been normalized by a first supply voltage applied to the representative cell at an input terminal thereof. The second threshold voltage has been normalized by a second sup ply voltage applied to the representative cell at the input terminal thereof. The third threshold voltage has been normalized by the first supply voltage applied to a target one of the cells, for which a time delay associated with a target one of the supply voltages should be obtained, at an input terminal thereof. And the fourth threshold voltage has been normalized by the second supply voltage applied to the target cell at the input terminal thereof. In the step b), first, a ratio of a time delay caused by the representative cell at the second supply voltage to a time delay caused by the representative cell at the first supply voltage is calculated. Next, a first time delay, corresponding to a given transition time of an input signal wave and a given load capacitance, is derived from a delay table describing time delays to be caused by the target cell where the first supply voltage is applied to the target cell. Then, a product of a difference between the first and third threshold voltages and the transition time of the input signal wave is added to the first time delay to obtain a sum. And the sum is multiplied by the ratio, thereby deriving a second time delay. In the step c), the time delay, caused by the target cell at the second supply voltage, is estimated as a third time delay by adding a product of a difference between the second and fourth threshold voltages and the transition time of the input signal wave to the second time delay.

Yet another inventive delay estimating method is also applicable to estimation of a time delay caused by one of multiple cells, including logic elements, in a semiconductor integrated circuit. The method includes the steps of: a) deriving an approximation function; b) obtaining delay data; c) deriving an interpolation function; and d) estimating a time delay. First, in the step a), time delays, which correspond to various supply voltages to be applied to a representative one of the cells and which have been obtained in advance through circuit simulations or actual measurement, are read out. Then, a relation between the time delays and the supply voltages applied to the representative cell is derived as the approximation function. Next, in the step b), delay data of respective instances, which make up the circuit, for the first supply voltage is obtained by reading out delay tables for the first supply voltage and calculating respective time delays, which will be caused by the instances, using the delay tables. Subsequently, in the step c), an interpolation function is derived for each said instance by reading out the approximation function and adding a constant, which is defined by reference to the delay data of the instances for the first supply voltage, to the approximation function. Finally, in the step d), data, representing the interpolation functions of the instances and the supply voltages applied to the instances, are read out to estimate a time delay caused by each said instance in accordance with associated one of the interpolation functions in a situation where the supply voltage as represented by the data is applied to the instance.

In one embodiment of the present invention, the cells are classified in the step a) into multiple groups according to circuit structures of the cells. The representative cell is selected from each of the groups and the approximation function is derived for each said representative cell. And the method further includes the step of selecting one of the approximation functions of the respective representative cells, which is associated with one of the groups where the instances causing the time delay calculated in the step b) be long, and reading out the approximation function in the step c).

According to the present invention, an interpolation function, representing a relation between time delays caused by each target cell and supply voltages applied thereto, is derived from an approximation function representing a relation between time delays caused by a representative cell and supply voltages applied thereto. And in accordance with the interpolation function, a time delay, which will be caused by the target cell when a target supply voltage is applied thereto, is estimated. In this manner, a time delay that will be caused by each target cell can be estimated with the threshold voltage of the cell taken into account. As a result, the time delay caused by the target cell can always be estimated accurately irrespective of the supply voltage value.

In addition, according to the present invention, a time delay caused by a representative cell at an arbitrary supply voltage is modified using a correction value that has been determined with the threshold voltage of a target cell taken in to account. As a result, the time delay caused by the target cell can always be estimated accurately irrespective of the supply voltage value.

Furthermore, according to the present invention, even if only a single delay table has been prepared for just one supply voltage, interpolation functions, representing a relation between time delays and supply voltages, are derived for respective instances. And in accordance with the interpolation function for each of these instances, a time delay caused by the instance at a target supply voltage is estimated. Accordingly, the time delay caused by each instance can be estimated accurately at any supply voltage.

BRIEF DESCRIPTION OF THE DRAWINGS

FIG. 10A illustrates a relation between the input and output signal waveforms of a representative cell where a predetermined supply voltage Vdd1 is applied thereto;

FIG. 10B illustrates a relation between the input and output signal waveforms of the representative cell where a target supply voltage Vdd2 is applied thereto;

FIG. 10C illustrates a relation between the input and output signal waveforms of a target cell where the predetermined supply voltage Vdd1 is applied thereto; and FIG. 10D illustrates a relation between the input and output signal waveforms of the target cell where the target supply voltage Vdd2 is applied thereto.

FIG. 11 is a flowchart illustrating respective processing steps of a delay estimating method according to a fifth embodiment of the present invention.

FIG. 14 illustrates a file on which interpolation functions, derived for respective instances, are stored in the fifth embodiment.

FIG. 15 illustrates a file on which supply voltages to be applied to respective instances are stored in the fifth embodiment.

DESCRIPTION OF THE PREFERRED EMBODIMENTS

Hereinafter, preferred embodiments of the inventive delay estimating method will be described with reference to the accompanying drawings.

EMBODIMENT 1

Figure 1:
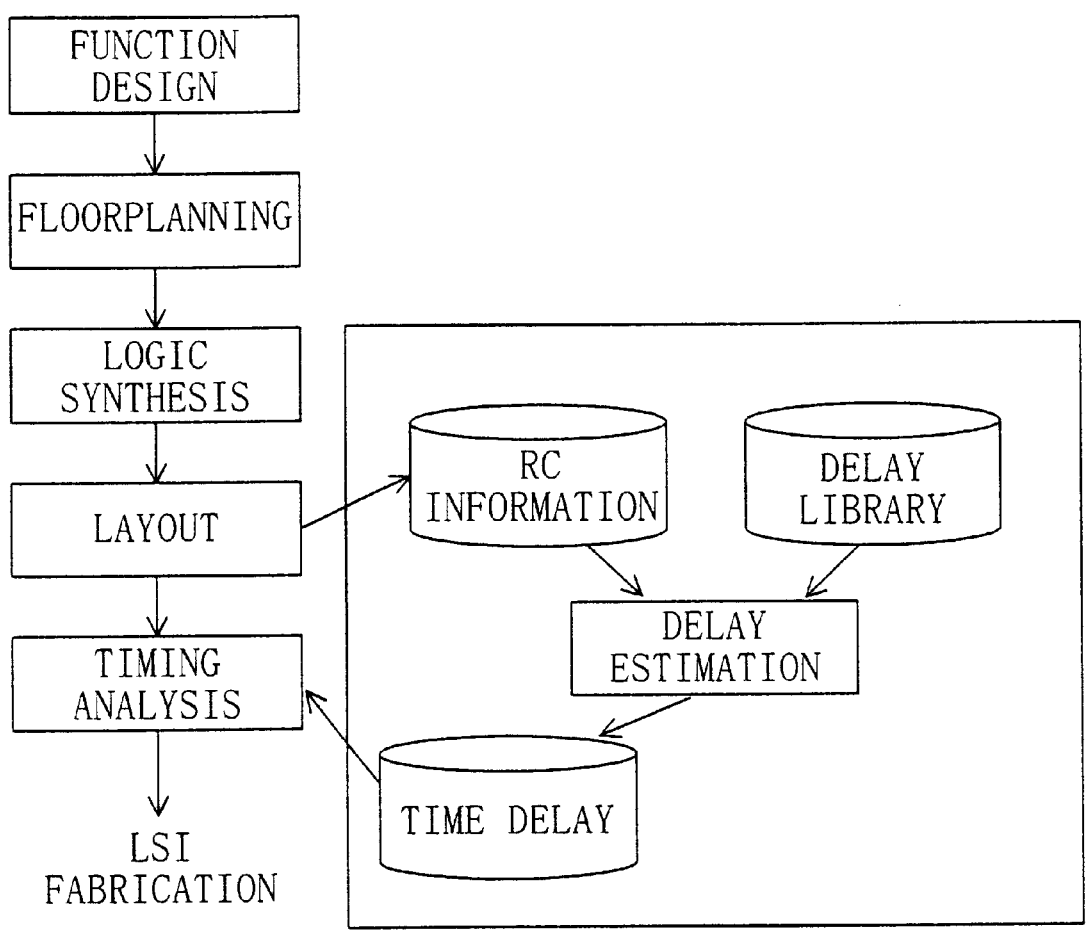
FIG. 1 is a flowchart illustrating a normal procedure started with the design of a semiconductor integrated circuit and ended with the fabrication thereof.

FIG. 1 schematically illustrates a normal procedure starting with the design of a semiconductor integrated circuit (LSI) and ending with the fabrication thereof. As shown in FIG. 1, first, the functions to be executed by the LSI are defined. Next, floorplanning is carried out by partitioning the LSI into multiple circuit blocks and then determining approximate sizes and locations of those blocks. Subsequently, the logic to be realized by the blocks is synthesized. Based on a result of this logic synthesis, various cells, included in each of these blocks, are laid out at their most appropriate locations and then interconnected together through a routing process. Thereafter, to make sure that the LSI thus designed will meet various delay constraints completely, in formation is collected about the resistance and capacitance (which will be herein called "RC information") formed by the cells and wires laid out. Next, delays to be caused by those cells and wires are estimated by utilizing the RC information and delay libraries for the cells. Then, each of the delays estimated is checked by seeing if the delay is less than the maximum allowable delay that should not be exceeded to meet the delay constraints. And after having confirmed that the results of all of these tests are GO, the LSI starts to be fabricated.

Figure 2:
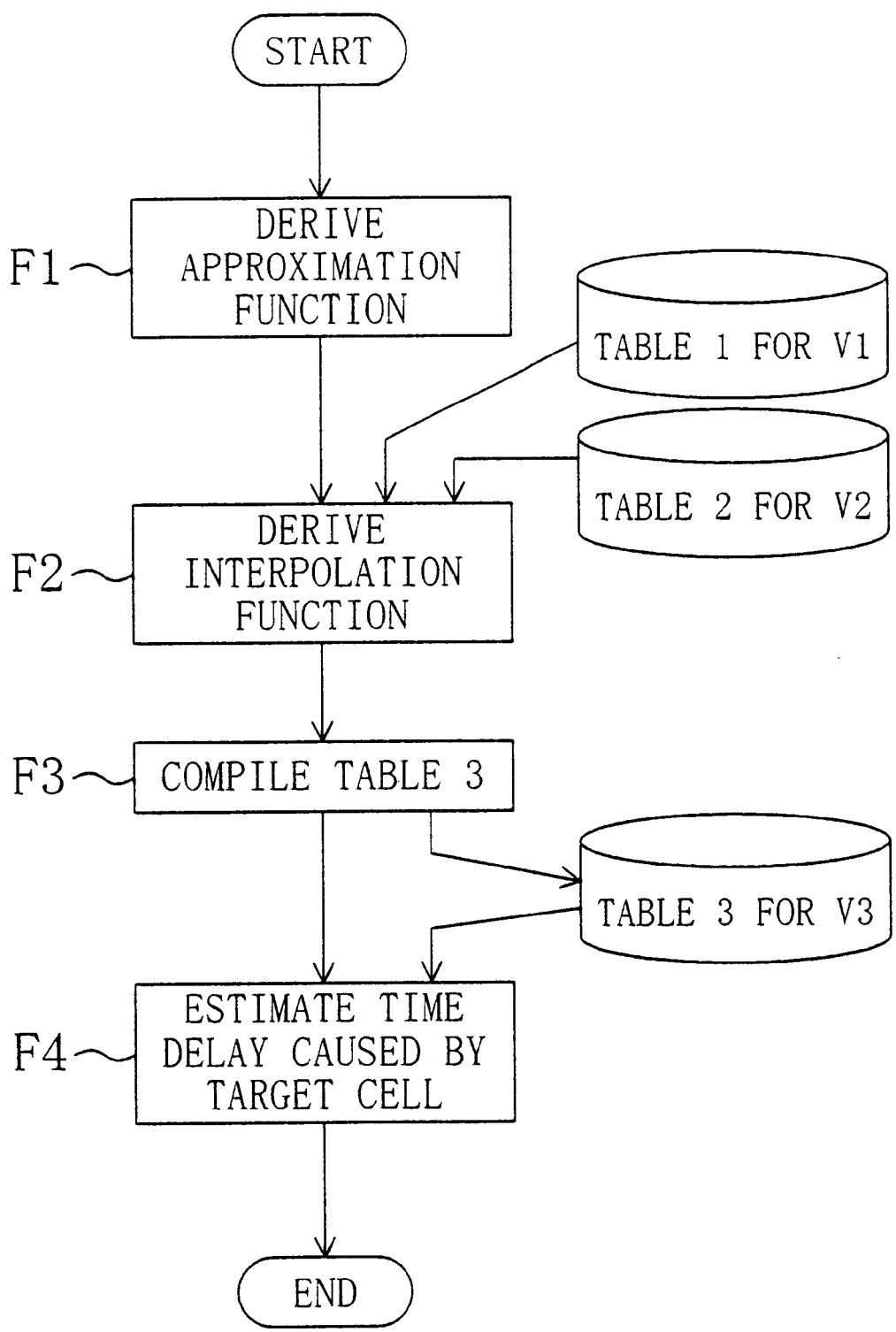
FIG. 2 is a flowchart illustrating respective processing steps of a delay estimating method according to a first embodiment of the present invention.

FIG. 2 is a flowchart illustrating respective processing steps of a delay estimating process according to a first embodiment of the present invention. In the process of the first embodiment, a delay table corresponding to a target supply voltage is compiled from delay tables corresponding to two mutually different supply voltages. And by using the delay table drawn up this way, a time delay to be caused by an arbitrary cell (which will be herein called a "target cell") is estimated. In FIG. 2, Tables 1, 2 and 3 are delay tables that are needed for the target cell and correspond to voltages V1, V2 and V3, respectively. Among these voltages, the delay tables have already been drawn up for the voltages V1 and V2, while the voltage V3 is a target voltage.

Figure 3:
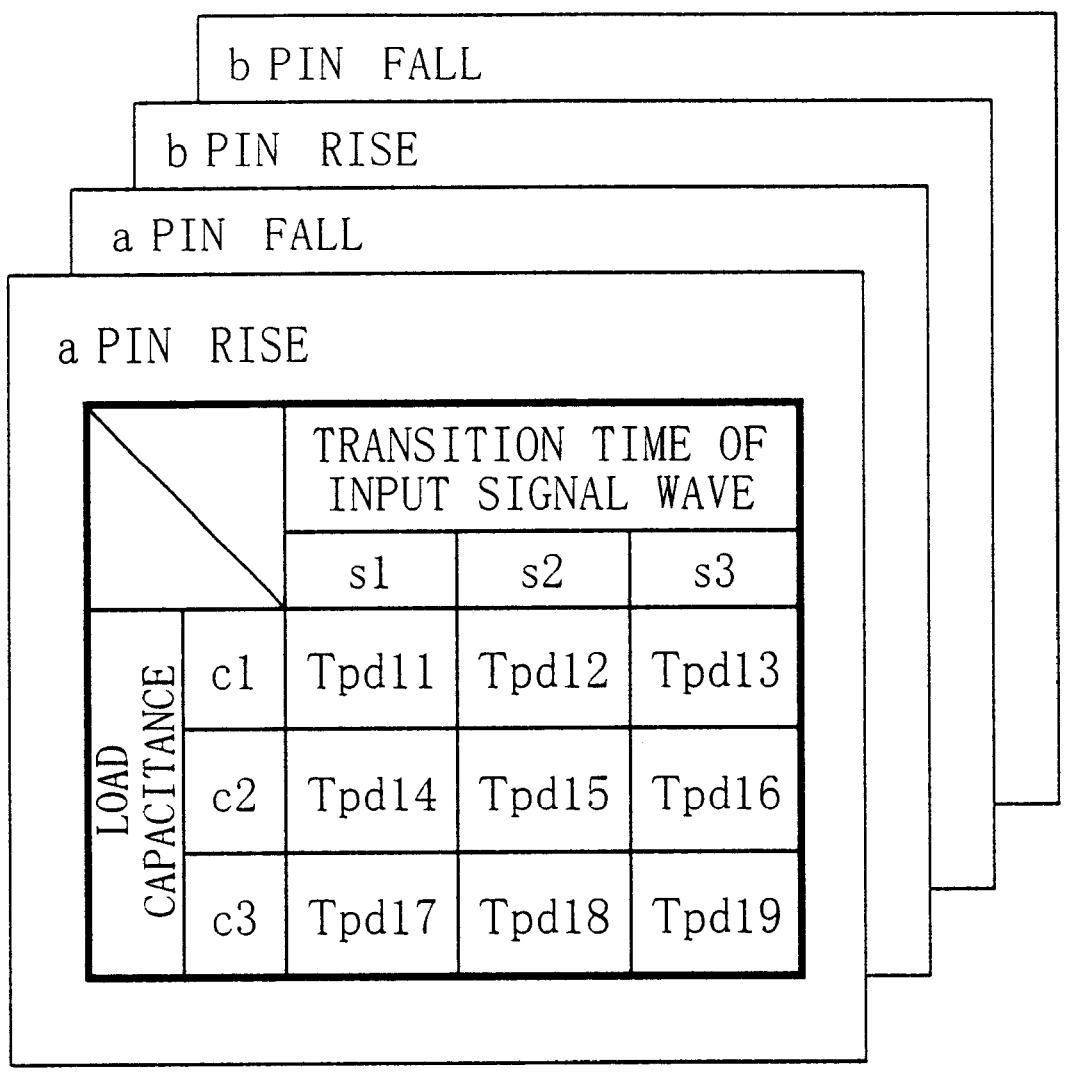
FIG. 3 illustrates delay tables for a target cell for use in the first embodiment.

FIG. 3 illustrates delay tables for the target cell. As shown in FIG. 3, the delay tables are provided for the rise and fall of a signal input to, and then output from, input pins a and b of the target cell. Accordingly, in this case, four different delay tables are provided in total.

Following is the contents of the Tables 1, 2 and 3 for the target cell:

TABLE 1

|    | s1    | s2    | s3    |
|----|-------|-------|-------|
| c1 | Tpd11 | Tpd12 | Tpd13 |
| c2 | Tpd14 | Tpd15 | Tpd16 |
| c3 | Tpd17 | Tpd18 | Tpd19 |

TABLE 2

|    | s1    | s2    | s3    |
|----|-------|-------|-------|
| c1 | Tpd21 | Tpd22 | Tpd23 |
| c2 | Tpd24 | Tpd25 | Tpd26 |
| c3 | Tpd27 | Tpd28 | Tpd29 |

TABLE 3

|    | s1    | s2    | s3    |
|----|-------|-------|-------|
| c1 | Tpd31 | Tpd32 | Tpd33 |
| c2 | Tpd34 | Tpd35 | Tpd36 |
| c3 | Tpd37 | Tpd38 | Tpd39 |

It should be noted that all of these Tables 1 through 3 were compiled under the same combination of conditions. In Tables 1 through 3, s1, s2 and s3 are transition times of an input signal wave and c1, c2 and c3 are load capacitances under the delay table indices. Tpd11 through Tpd19 are time delays caused where the supply voltage V1 is applied to the target cell under the delay table indices. Tpd21 through Tpd29 are time delays caused where the supply voltage V2 is applied to the target cell under the delay table indices. And Tpd31 through Tpd39 are time delays caused where the target supply voltage V3 is applied to the target cell.

Figure 5:
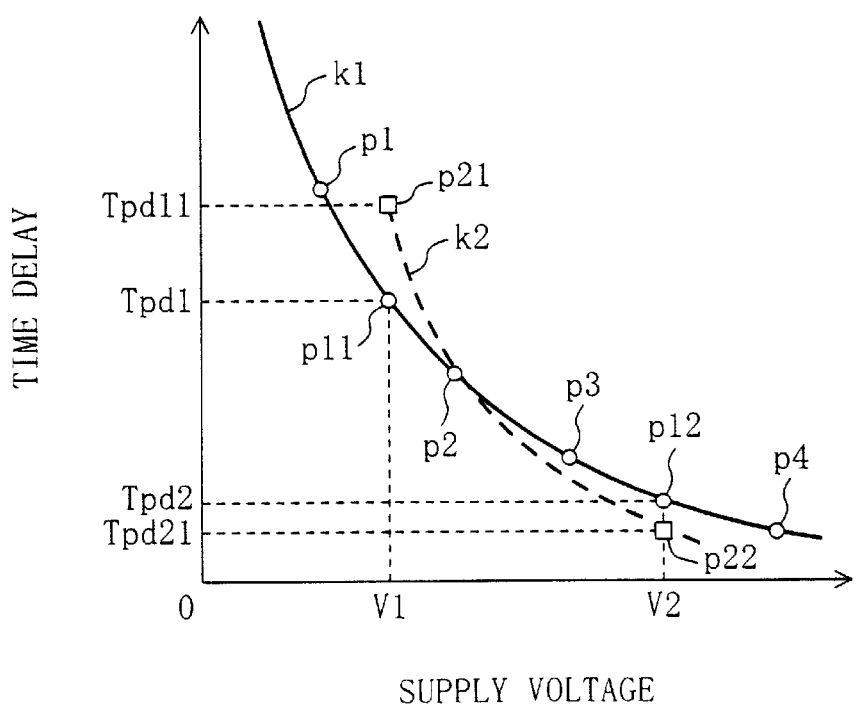
FIG. 5 is a graph illustrating approximation and interpolation functions, each representing time delays as a function of supply voltages, in the first embodiment.

FIG. 5 illustrates approximation and interpolation functions, each representing time delays as a function of supply voltages. In FIG. 5, the solid-line curve k1 represents a relation between time delays caused by a predetermined one of the cells (i.e., representative cell) and supply voltages. The data shown in FIG. 5 was obtained through circuit simulations or actual measurement. The points p1, p2, p3 and p4 are plotted as respective time delays caused by the representative cell for various supply voltages and were obtained as a result of the circuit simulations or actual measurement. The points p11 and p12 are plotted as respective time delays Tpd1 and Tpd2 of the representative cell corresponding to the supply voltages V1 and V2, respectively. On the other hand, the points p21 and p22 are plotted as respective time delays Tpd11 and Tpd21 of the target cell corresponding to the supply volt ages V1 and V2, respectively. And the dashed-line curve k2 passes these points p21 and p22.

In this case, the representative cell may be selected in the following manner. For example, a cell, which is most likely to be implemented in a semiconductor integrated circuit and whose variation in delay represents an average among a number of possible variations caused by all the cells when the supply voltage is changed, may be selected. In this case, the variations in delay can be obtained through circuit simulations or actual measurement.

To estimate delay even more accurately, multiple cells may be classified into a plurality of groups according to the features of the circuit structures thereof. And one of cells in each group may be selected as the representative cell. The cells may be grouped depending on whether p- or n-channel transistors are arranged vertically or horizontally and whether the number of gate stages of each transistor is single or plural. By selecting the representative cell from each group of cells in this manner, the error between the approximation function for the representative cell and the interpolation function for the target cell can be reduced. As a result, the time delay caused by the target cell can be estimated accurately enough.

Figure 6:
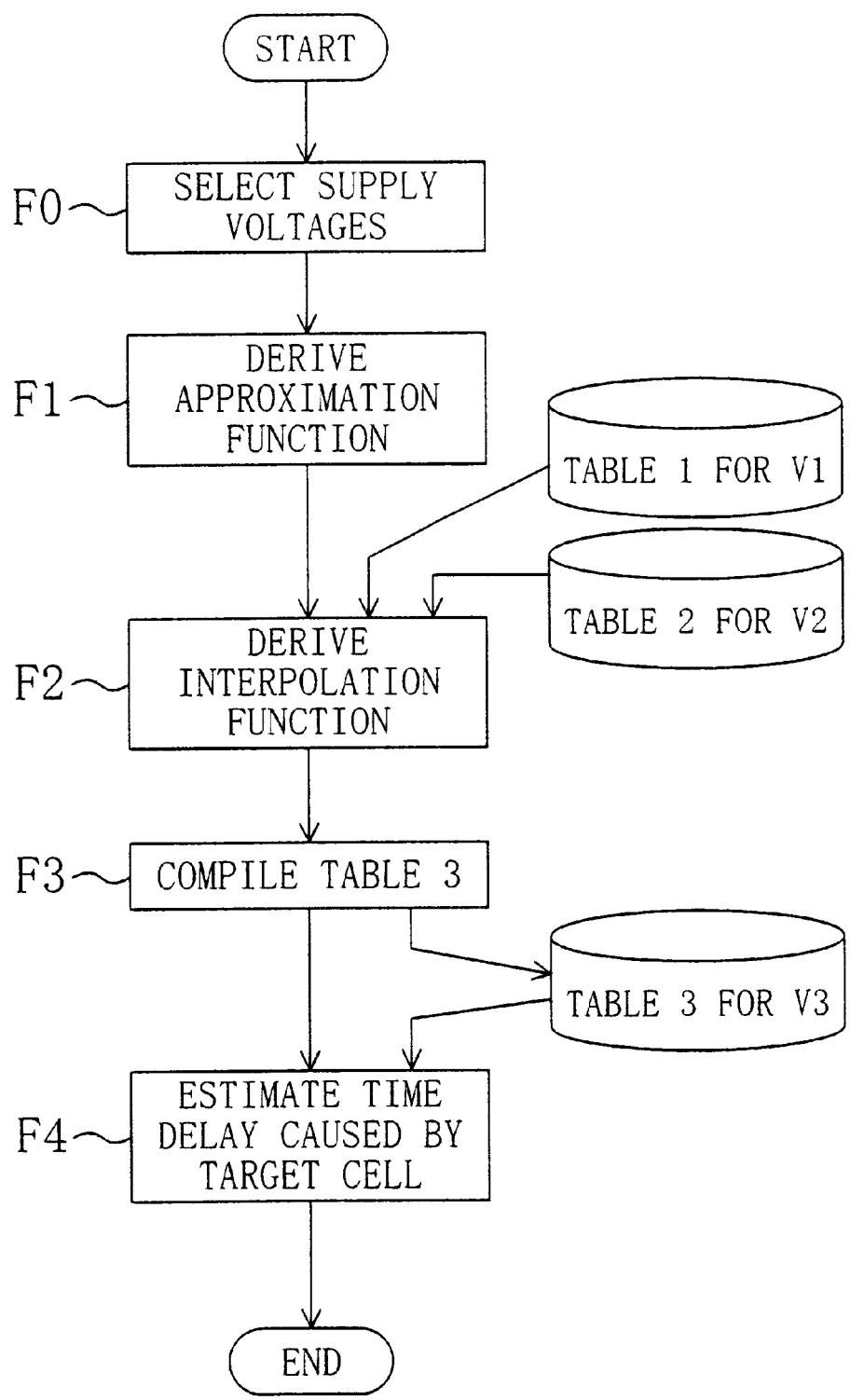
FIG. 6 is a flowchart illustrating respective processing steps of a delay estimating method according to a modified example of the first embodiment.

FIG. 6 is a flowchart illustrating respective processing steps to be performed where three or more mutually different delay tables are prepared for the same number of supply voltages.

Hereinafter, it will be described with reference to FIGS. 1 through 6 how to estimate a time delay by compiling Table 3 from Tables 1 and 2.

First, in Step F1 shown in FIGS. 2 and 6, an approximation function representing the curve k1 shown in FIG. 5 is derived. The approximation function k1 is given by the following Equation (1) for estimating a time delay f(Vdd) using an arbitrary supply voltage Vdd:

$$f(Vdd)=M0 \times Vdd^{\alpha 0}+ \ldots +Mn \times Vdd^{\alpha n} \quad (1)$$

where Vdd is the supply voltage, M0 through Mn are coefficients and $\alpha 0$ through $\alpha n$ are multipliers. The multipliers $\alpha 0$ through $\alpha n$ are preferably between 1 and 4. In that case, Equation (1) may be represented as the following Equation (2):

$$f(Vdd)=M0+M1 \times Vdd+M2 \times Vdd^2+M3 \times Vdd^3+M4 \times Vdd^4 \quad (2)$$

where the coefficient values M0 through M4 are determined based on the time delays that were obtained with the supply voltage changed through circuit simulations or actual measurement (i.e., the time delays plotted as the points p1 through p4 in FIG. 5).

Figure 4:
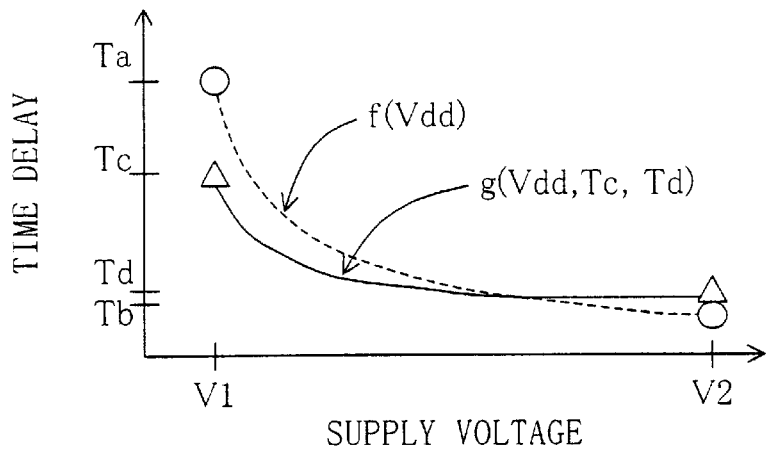
FIG. 4 is a graph illustrating how to estimate a time delay g(Vdd, Tc, Td) caused by a target cell from a time delay f(Vdd) caused by a representative cell in the first embodiment.

Next, in Step F2 shown in FIGS. 2 and 6, a function representing the time delays of the target cell (i.e., the interpolation function g(Vdd)) is derived from the function f(Vdd) representing the time delays of the representative cell as shown in FIG. 4. Hereinafter, it will be described how to represent this interpolation function g(Vdd).

If an input slew rate represents a steep voltage rise and if an output voltage reaches a threshold voltage after an input signal has inverted its level, then the function f(Vdd) representing the time delays against a variation in supply voltage is given by the following Equation (3):

$$f(vdd) = \frac{vdd - V_{INV}}{vdd} t_T - \frac{C_L}{\lambda_n I_{DO}} \log \frac{V_{INV} + 1/\lambda_n}{V_{TT} + 1/\lambda_n} \quad (3)$$

where $V_{INV}$ is the threshold voltage, $t_T$ is the transition time of an input signal wave, $C_L$ is the output load capacitance, $I_{DO}$ is a current flowing through a transistor when the transistor changes from a saturated region into a non-saturated region, $\lambda n$ is the slope of the drain-source current $I_{DS}$ where the n-channel is in the saturated region and $V_{TT}$ is the output voltage just after the input signal waveform has changed its level, i.e., immediately after the transition time $t_T$ has passed. The current $I_{DO}$ is given by the following Equation $$I_{DO} = B \frac{W}{L} (vdd - V_{TH})^2 \quad (4)$$

where B is a constant and W, L and $V_{TH}$ are the width, length and threshold voltage of the transistor.

In accordance with Equation (3), a ratio of the time delay g(Vdd) caused by the target cell to the time delay f(Vdd) caused by the representative cell is given by the following Equation (5):

$$\frac{\frac{\partial g(vdd)}{\partial vdd}}{\frac{\partial f(vdd)}{\partial vdd}} = \frac{\frac{2KC_L}{\lambda_n B \frac{W_b}{L_b}(vdd-V_{TH})^3}}{\frac{2KC_L}{\lambda_n B \frac{W_a}{L_a}(vdd-V_{TH})^3}} = \frac{\frac{L_b}{W_b}}{\frac{L_a}{W_a}} \quad (5)$$

where $L_a$ and $W_a$ are the length and width of the representative cell and $L_b$ and $W_b$ are the length and width of the target cell. In this case, supposing the slope $\lambda n \approx 0$, the logarithm term in Equation (3) may be replaced with a constant K. Also, the threshold voltage $V_{INV}$ of the representative cell is supposed to be Vdd/2. Thus, as can be seen from Equation (5), the rate of the time delay g(Vdd) of the target cell to the time delay f(Vdd) of the representative cell against a variation in supply voltage can be represented by a constant.

Accordingly, supposing the time delays caused by the representative cell at the supply voltages V1 and V2 are represented as Ta and Tb and the time delays caused by the target cell at V1 and V2 are represented as Tc and Td, then the following Equation (6) is derived:

$$\frac{(Tc-Td)/(V1-V2)}{(Ta-Tb)/(V1-V2)} = \frac{(TC-g(vdd))/(V1-vdd)}{(Ta-f(vdd))/(V1-vdd)} \quad (6)$$

And by modifying this Equation (6), the time delay g(Vdd) caused by the target cell is derived from the time delay f(Vdd) caused by the representative cell by the following Equation (7):

$$g(vdd, Tc, Td) = \frac{(Tc-Td)}{(Ta-Tb)} * (f(vdd) - Ta) + Tc \quad (7)$$

Thus, in Step F2 of deriving the interpolation function, time delays g(Vdd, Tpd11, Tpd21), g(Vdd, Tpd12, Tpd22), . . . , and g(Vdd, Tpd19, Tpd29), corresponding to respective pairs of delay table indices, are obtained from the time delays described on Tables 1 and 2 and the time delay f(Vdd). Specifically, first, the time delay g(Vdd, Tpd11, Tpd21) is obtained by substituting the time delays Tpd11 and Tpd21, corresponding to the load capacitance c1 and transition time s1. The time delay g(Vdd, Tpd11, Tpd21) is given by the following Equation (8):

$$g(Vdd, Tpd11, Tpd21) = (f(Vdd)-Tpd1) \times [(Tpd11-Tpd21)/(Tpd1-Tpd2)]+Tpd11 \quad (8)$$

In this case, Equation (8) has been arranged by determining the values of constants A1 and B1 so that if g(Vdd, Tpd11, Tpd21)=f(Vdd)×A1+B1, then the equations g(Vdd, Tpd11, Tpd21) =Tpd11 and g(Vdd, Tpd11, Tpd21)=Tpd21 are met.

In obtaining the other time delays g(Vdd, Tpd12, Tpd22) through g(Vdd, Tpd19, Tpd29), constants A2 through A9 and B2 through B9, corresponding to the constants A1 and B1, respectively, are determined in the same way.

Next, in Step F3 shown in FIGS. 2 and 6, the target supply voltage V3 is substituted for the supply voltage Vdd in the time delays g(Vdd, Tpd11, Tpd21) through g(Vdd, Tpd19, Tpd29) obtained in Step F2, thereby calculating the time delays Tpd31 through Tpd39 and compiling the delay table 3.

Thereafter, in Step F4 shown in FIGS. 2 and 6, the transition time of an input signal wave and load capacitance for the target cell are read out. Then, Table 3 drawn up in Step F3 is searched for the particular transition time and load capacitance to find the time delay corresponding to the target supply voltage V3. If no time delays, corresponding to the given transition time and load capacitance, have been found in Table 3, then the time delay is estimated by interpolation. For example, linear interpolation may be used.

In this manner, according to the first embodiment, the approximation function is derived for the representative cell and delay tables, corresponding to two mutually different supply voltages, are applied to an arbitrary cell. Thus, it is possible to take one of various threshold voltages, corresponding to respective supply voltages, into account for each cell or input terminal. That is to say, the delay can be estimated very accurately with its dependence on the supply voltage fully taken into account for each cell or input terminal.

If three or more delay tables corresponding to the same number of supply voltages have been prepared, then two of delay tables associated with two of the supply voltages, which are closest to the target supply voltage, may be selected in Step F0 shown in FIG. 6.

EMBODIMENT 2

Figure 7:
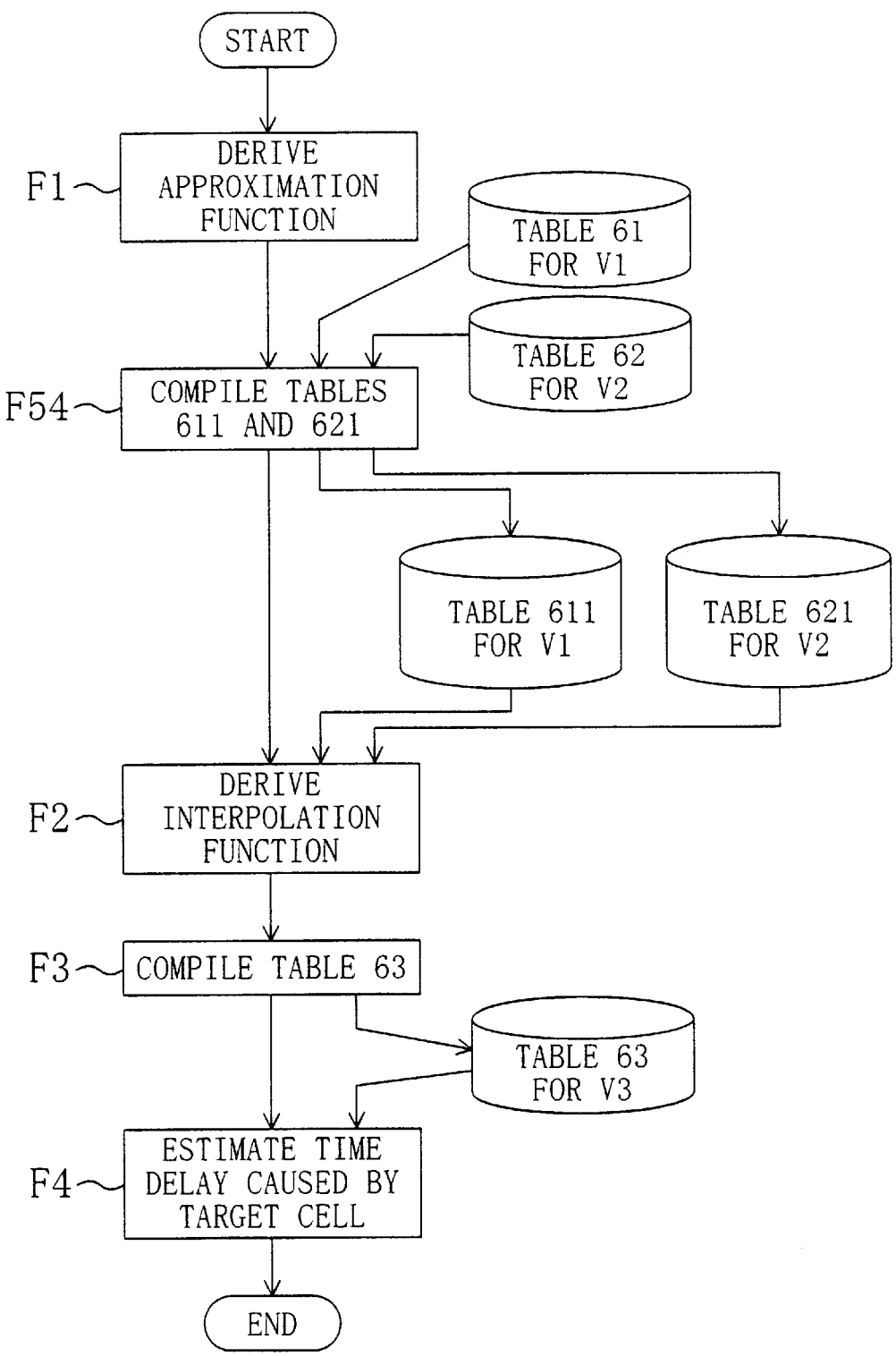
FIG. 7 is a flowchart illustrating respective processing steps of a delay estimating method according to a second embodiment of the present invention.

FIG. 7 is a flowchart illustrating respective processing steps of a delay estimating method according to a second embodiment of the present invention. The method of the second embodiment is applicable to a situation where the delay table indices for the supply voltage V1 are different from those for the supply voltage V2.

In FIG. 7, Tables 61 and 62 describe the time delays caused by an arbitrary cell (i.e., the target cell) where the supply voltages V1 and V2 are applied thereto, respectively. Tables 611 and 621 are each obtained by combining Tables 61 and 62 together in Step F54. The other processing steps F1, F2, F3 and F4 are the same as the counterparts of the first embodiment illustrated in FIG. 2.

Following is the contents of Table 61 describing the time delays caused by the target cell where the supply voltage V1 is applied thereto:

TABLE 61

|  | s11 | s12 | s13 |
|---|---|---|---|
| c11 | Tpd11 | Tpd12 | Tpd13 |
| c12 | Tpd14 | Tpd15 | Tpd16 |
| c13 | Tpd17 | Tpd18 | Tpd19 | where s11, s12 and s13 are transition times of an input signal wave and c11, c12 and c13 are load capacitances under a combination of delay table indices and Tpd11 through Tpd19 are time delays caused by the target cell where the supply voltage V1 is applied thereto.

Following is the contents of Table 62 describing the time delays caused by the target cell where the supply voltage V2 is applied thereto:

TABLE 62

|  | s21 | s22 | s23 |
|---|---|---|---|
| c21 | Tpd21 | Tpd22 | Tpd23 |
| c22 | Tpd24 | Tpd25 | Tpd26 |
| c23 | Tpd27 | Tpd28 | Tpd29 | where s21, s22 and s23 are transition times of an input signal wave and c21, c22 and c23 are load capacitances under a different combination of delay table indices and Tpd21 through Tpd29 are time delays caused by the target cell where the supply voltage V2 is applied thereto.

Where the supply voltage V1 is applied to the target cell, Tables 61 and 62 may be combined together into Table 611 with the following contents:

TABLE 611

|  | s11 | s21 | S12 | s22 | s13 | s23 |
|---|---|---|---|---|---|---|
| c11 | Tpd11 | t1 | Tpd12 | t2 | Tpd13 | t3 |
| c21 | t4 | t5 | t6 | t7 | t8 | t9 |
| c12 | Tpd14 | t10 | Tpd15 | t11 | Tpd16 | t12 |
| c22 | t13 | t14 | T15 | t16 | t17 | t18 |
| c13 | Tpd17 | t19 | Tpd18 | t20 | Tpd19 | t21 |
| c23 | t22 | t23 | T24 | t25 | t26 | t27 | where t1 through t27 are time delays corresponding to respective transition times and load capacitances other than the combination of the transition times s11, s12 and s13 and load capacitances c11, c12 and c13 in Table 61. The delay table indices for Table 611 include the transition times s11, s21, s12, s22, s13 and s23 and load capacitances c11, c21, c12, c22, c13 and c23 that represent the logical sum of the two combinations of delay table indices for Tables 61 and 62.

On the other hand, where the supply voltage V2 is applied to the target cell, Tables 61 and 62 may be combined together into Table 621 with the following contents:

TABLE 621

|  | s11 | s21 | s12 | s22 | s13 | s23 |
|---|---|---|---|---|---|---|
| c11 | t28 | t29 | t30 | t31 | t32 | t33 |
| c21 | t34 | Tpd21 | t35 | Tpd22 | t36 | Tpd23 |
| c12 | t37 | t21 | t38 | t13 | t39 | t40 |
| c22 | t41 | Tpd24 | t42 | Tpd25 | t43 | Tpd26 |
| c13 | t44 | t45 | t46 | t47 | t48 | t49 |
| c23 | t50 | Tpd27 | t51 | Tpd28 | t52 | Tpd29 | where t28 through t52 are time delays corresponding to respective transition times and load capacitances other than the combination of the transition times s21, s22 and s23 and the load capacitances c21, c22 and c23 in Table 62. The delay table indices for Table 621 are the same as those for Table 611.

Table 63 is obtained by deriving an interpolation function from the time delays described on Tables 611 and 621, substituting the supply voltage V3 into the interpolation function and compiling a table from the resultant time delays. Following is the contents of Table 63:

TABLE 63

|  | s11 | s21 | s12 | s22 | s13 | s23 |
|---|---|---|---|---|---|---|
| c11 | Tpd301 | Tpd302 | Tpd303 | Tpd304 | Tpd305 | Tpd306 |
| c21 | Tpd307 | Tpd308 | Tpd309 | Tpd310 | Tpd311 | Tpd312 |
| c12 | Tpd313 | Tpd314 | Tpd315 | Tpd316 | Tpd317 | Tpd318 |
| c22 | Tpd319 | Tpd320 | Tpd321 | Tpd322 | Tpd323 | Tpd324 |
| c13 | Tpd325 | Tpd326 | Tpd327 | Tpd328 | Tpd329 | Tpd330 |
| c23 | Tpd331 | Tpd332 | Tpd333 | Tpd334 | Tpd335 | Tpd336 | where Tpd301 through Tpd336 are time delays obtained by the interpolation function.

Hereinafter, it will be described with reference to FIG. 7 and Tables 61, 62, 611, 621 and 63 how to estimate a time delay caused by a target cell according to the second embodiment.

As described above, in Step F54, a logical sum is derived from the two combinations of delay table indices for Tables 61 and 62 to define a new combination of delay table indices. Then, Tables 611 and 621, corresponding to the supply voltages V1 and V2, respectively, are drawn up under the newly defined conditions.

In this case, the time delays are described on Table 611 in the following manner. Specifically, the time delays Tpd11 through Tpd19 described on Table 61 are transcribed onto Table 611 as they are. The other time delays t1 through t27 are obtained by interpolating the time delays Tpd11 through Tpd19 described on Table 61. The time delays described on Table 621 are also obtained in a similar manner.

Next, Steps F2 and F3 are performed using Tables 611 and 621, thereby compiling Table 63 and estimating the time delays where the supply voltage V3 is applied to the target cell.

According to the second embodiment, even if two delay tables, compiled under mutually different combinations of conditions, are provided, a logical sum is derived from those two combinations of conditions to newly compile and use another two delay tables for two different supply voltages. In this manner, a time delay caused by a target cell can be estimated very accurately as in the first embodiment with its dependence on the supply voltage fully taken into account for each cell or input terminal.

In Step S54, a logical sum is derived from the delay table indices for Tables 61 and 62 to draw up Tables 611 and 621. Alternatively, the following Tables 612 and 622 may also be compiled by using transition times s31, s32 and s33 and load capacitances c31, c32 and c33, which are obtained by linear interpolation, as another combination of delay table indices. That is to say, in that case, a new combination of delay table indices is obtained by linearly interpolating the two combinations of delay table indices for the supply volt ages V1 and V2, respectively.

TABLE 612

|  | s31 | s32 | s33 |
|---|---|---|---|
| c31 | t1 | t2 | t3 |
| c32 | t4 | t5 | t6 |
| c33 | t7 | t8 | t9 |

TABLE 622

|  | s31 | s32 | s33 |
|---|---|---|---|
| c31 | t10 | t11 | t12 |
| c32 | t13 | t14 | t15 |
| c33 | t16 | t17 | t18 | where s31, s32 and s33 are transition times and c31, c32 and c33 are load capacitances under the newly defined combination of delay table indices. For example, the transition time s31 is obtained by linearly interpolating the transition times s11 and s21. The other transition times s32 and s33 and the load capacitances c31, c32 and c33 may also be obtained by similar linear interpolation.

EMBODIMENT 3

Figure 8:
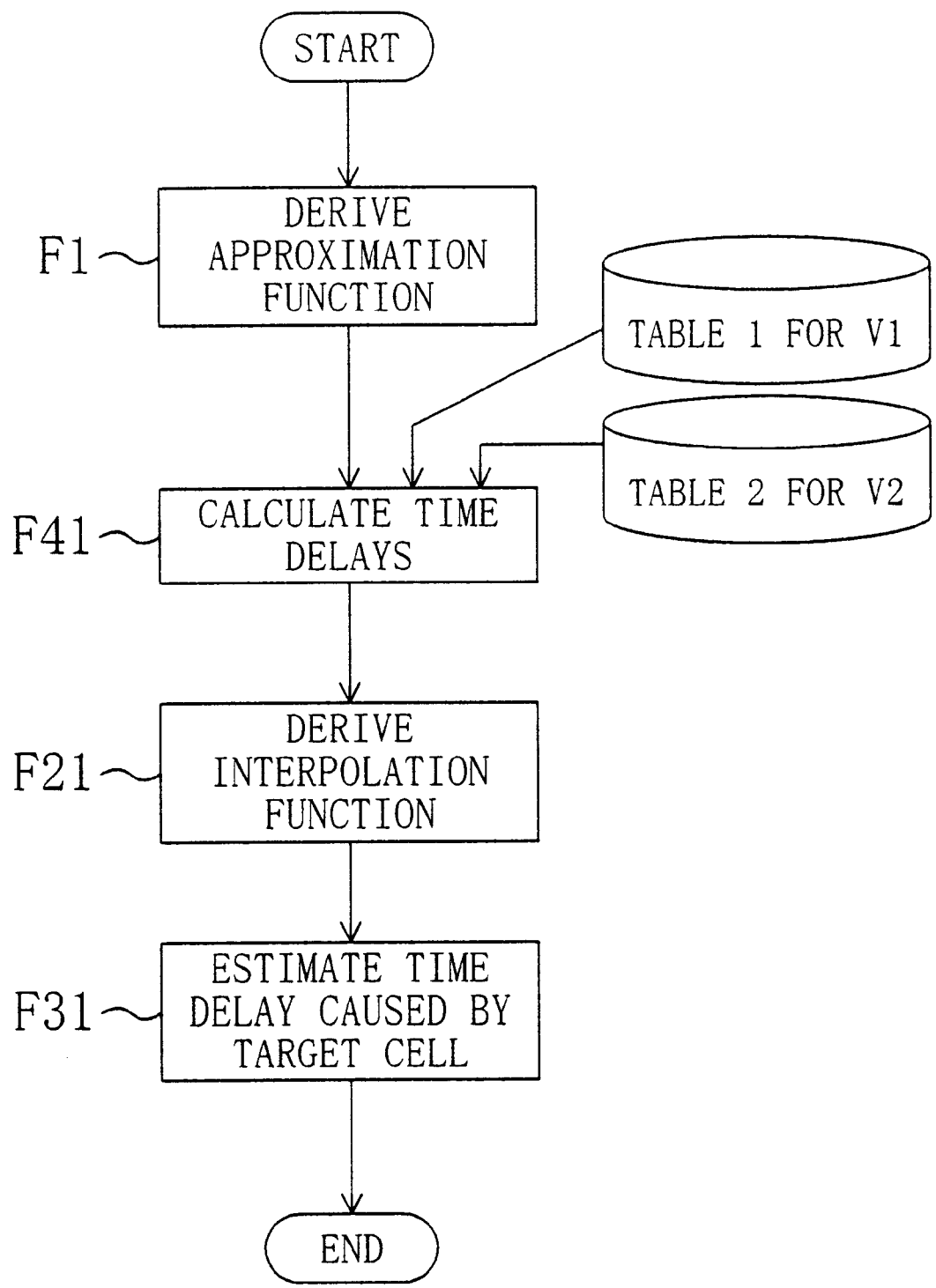
FIG. 8 is a flowchart illustrating respective processing steps of a delay estimating method according to a third embodiment of the present invention.

FIG. 8 is a flowchart illustrating respective processing steps of a delay estimating method according to a third embodiment of the present invention. The third embodiment will be described with reference to not only FIG. 8 but also FIG. 5 and Tables 1, 2 and 3 for the first embodiment.

In FIG. 8, Step F1 is the same as that of the first embodiment shown in FIG. 2 and the description thereof will be omitted herein. Next, in Step F41, using Table 1 describing the time delays caused by the target cell at the supply voltage V1, a time delay T1 of the target cell, associated with the transition time S of the signal wave input and the load capacitance C, are obtained through interpolation. In addition, using Table 2 describing the time delays caused by the target cell at the supply voltage V2, a time delay T2 of the target cell, associated with the transition time S and load capacitance C, are also obtained through interpolation.

Subsequently, in Step F21, using the time delays T1 and T2 and the time delay f(Vdd) defined for the first embodiment, a time delay g(Vdd, T1, T2) given by the following Equation (9) is defined:

$$g(Vdd, T1, T2) = (f(Vdd) - Tpd1) \times [(T1-T2)/(Tpd1-Tpd2)] + T1 \quad (9)$$

where the time delays Tpd11 and Tpd21 in Equation (8) are replaced with the time delays T1 and T2, respectively.

Subsequently, in Step F31, the target supply voltage V3 is substituted for Vdd in Equation (9), thereby obtaining the time delay g(V3, T1, T2) corresponding to the transition time S and load capacitance C.

According to the third embodiment, a time delay corresponding to a target voltage is obtained for a given transition time S and a given load capacitance C by interpolating time delays associated with mutually different supply voltages. In this manner, a delay caused by a target cell can be estimated very accurately with its dependence on the supply voltage fully taken into account for each cell or input terminal and without compiling any new delay table for the target supply voltage.

EMBODIMENT 4

FIGS. 10A through 10D are graphs illustrating respective relations between input and output signal waveforms according to a fourth embodiment of the present invention. The waveforms illustrated in FIGS. 10A through 10D are obtained by applying either a supply voltage Vdd1, for which a delay table has already been prepared, or a target supply voltage Vdd2 to a representative or target cell.

Figure 10A:
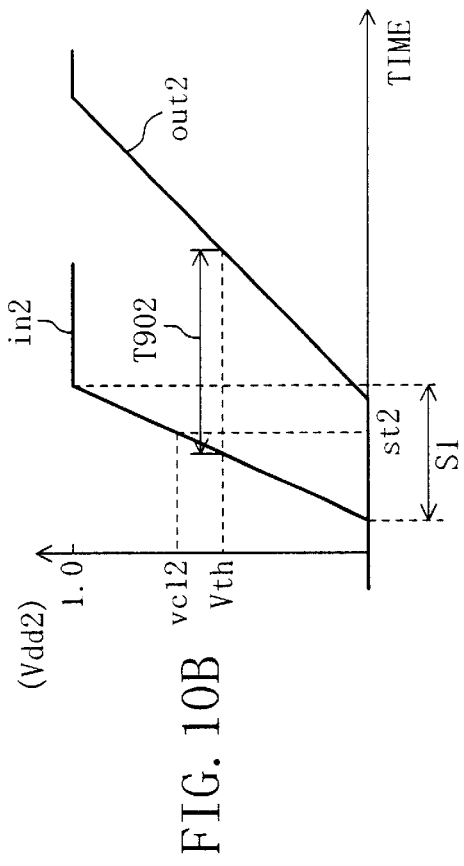
FIGS. 10A through 10D are graphs illustrating respective relations between input and output signal waveforms according to the fourth embodiment.
Figure 10B:
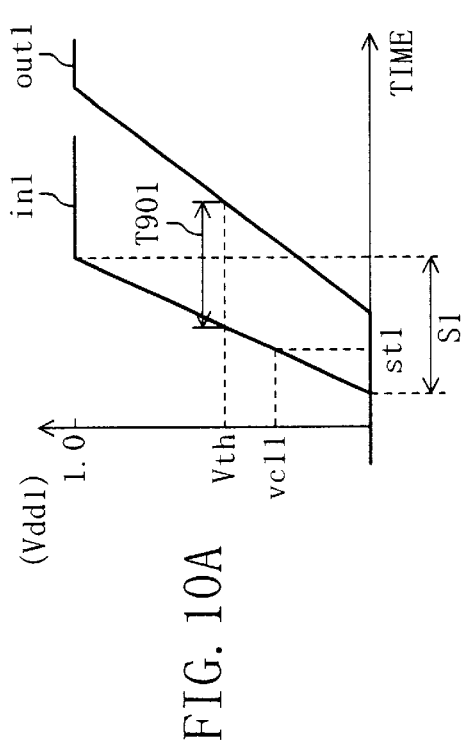
Figure 10C:
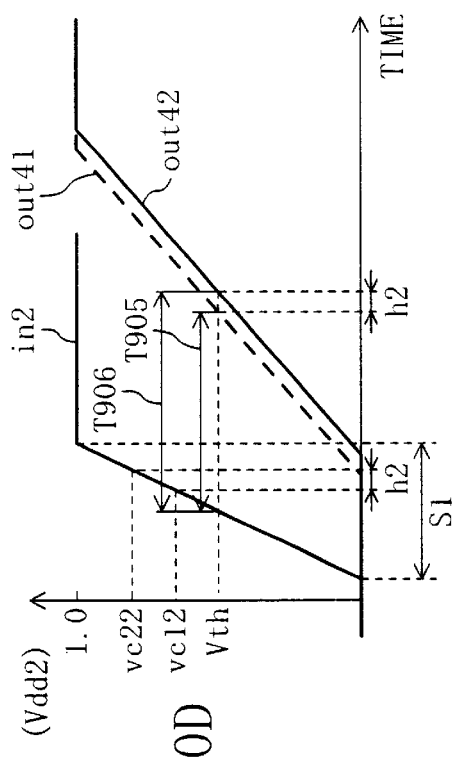
Figure 10D:
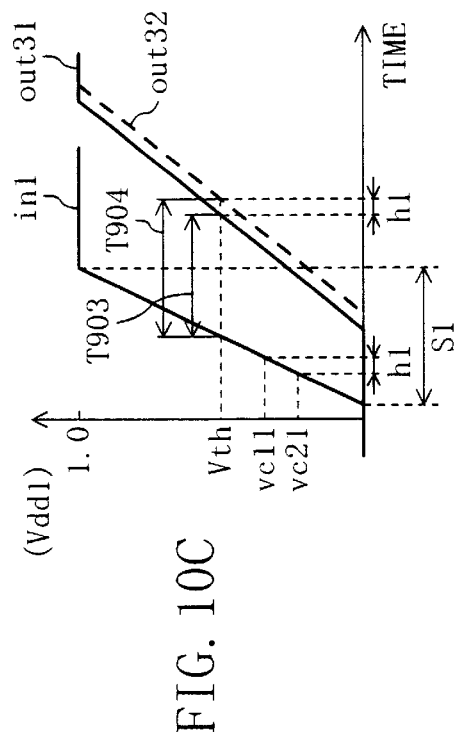

Specifically, FIG. 10A illustrates the input and output signal waveforms of a representative cell where the supply voltage Vdd1 is applied thereto. FIG. 10B illustrates the input and output signal waveforms of the representative cell where the target supply voltage Vdd2 is applied thereto. FIG. 10C illustrates the input and output signal waveforms of a target cell where the supply voltage Vdd1 is applied thereto. And FIG. 10D illustrates the input and output signal waveforms of the target cell where the target supply voltage Vdd2 is applied thereto. In FIGS. 10A through 10D, the voltage values have been normalized with their supply voltages.

Also, in FIGS. 10A through 10D, Vth is a threshold voltage used as a reference voltage in estimating a time delay. In FIG. 10A, vc11 is a threshold voltage normalized by the supply voltage Vdd1 at an input terminal of the representative cell where the supply voltage Vdd1 is applied to the cell (i.e., a first threshold voltage). In FIG. 10B, vc12 is a threshold voltage normalized by the supply voltage Vdd2 at the input terminal of the representative cell where the supply voltage Vdd2 is applied to the cell (i.e., a second threshold voltage). In FIG. 10C, vc21 is a threshold voltage normalized by the supply voltage Vdd1 at an input terminal of the target cell where the supply voltage Vdd1 is applied to the cell (i.e., a third threshold voltage). And in FIG. 10D, vc22 is a threshold voltage normalized by the supply voltage Vdd2 at the input terminal of the target cell where the supply voltage Vdd2 is applied to the cell (i.e., a fourth threshold voltage).

In FIGS. 10A through 10D, S1 is a transition time of an input signal wave, i.e., a period of time taken for the input signal wave to rise from VSS to the supply voltage Vdd1 or Vdd2. In FIGS. 10A and 10C, in1 is the input signal waveform with the transition time S1 where the supply voltage Vdd1 is applied to the representative or target cell. In FIGS. 10B and 10D, in2 is the input signal waveform with the transition time S1 where the supply voltage Vdd2 is applied to the representative or target cell.

In FIG. 10A, out1 is the output signal waveform where the input signal wave in1 is applied to the representative cell and st1 is a point in time when the input signal waveform in1 reaches the threshold voltage vc11. And the output signal waveform out1 starts to change at this time st1. Also, in FIG. 10A, T901 represents a time delay where the supply voltage Vdd1 is applied to the representative cell.

In FIG. 10B, out2 is the output signal waveform where the input signal wave in2 is applied to the representative cell and st2 is a point in time when the input signal waveform in2 reaches the threshold voltage vc12. And the output signal waveform out2 starts to change at this time st2. Also, in FIG. 10B, T902 represents a time delay where the supply voltage Vdd2 is applied to the representative cell.

In FIG. 10C, out31 is the output signal waveform that starts to change from the threshold voltage vc11 where the input signal waveform in1 is applied to the target cell. Also in FIG. 10C, out32 is the output signal waveform that starts to change from the threshold voltage vc21 where the input signal waveform in1 is applied to the target cell. Furthermore, in FIG. 10C, h1 is a period of time taken for the input signal waveform in1 to rise from the threshold voltage vc21 to the threshold voltage vc11. T903 and T904 are time delays for the output signal waveforms out31 and out32, respectively. T904 is equal to the sum of the time delay T903 and the time h1.

In FIG. 10D, out41 is the output signal waveform that starts to change from the threshold voltage vc12 where the input signal waveform in2 is applied to the target cell. Also in FIG. 10D, out42 is the output signal waveform that starts to change from the threshold voltage vc22 where the input signal waveform in2 is applied to the target cell. Furthermore, in FIG. 10D, h2 is a period of time taken for the input signal waveform in2 to rise from the threshold voltage vc12 to the threshold voltage vc22. T905 and T906 are time delays for the output signal waveforms out41 and out42, respectively. T906 is the time delay caused by the target cell where the supply voltage Vdd2 is applied thereto.

Figure 9:
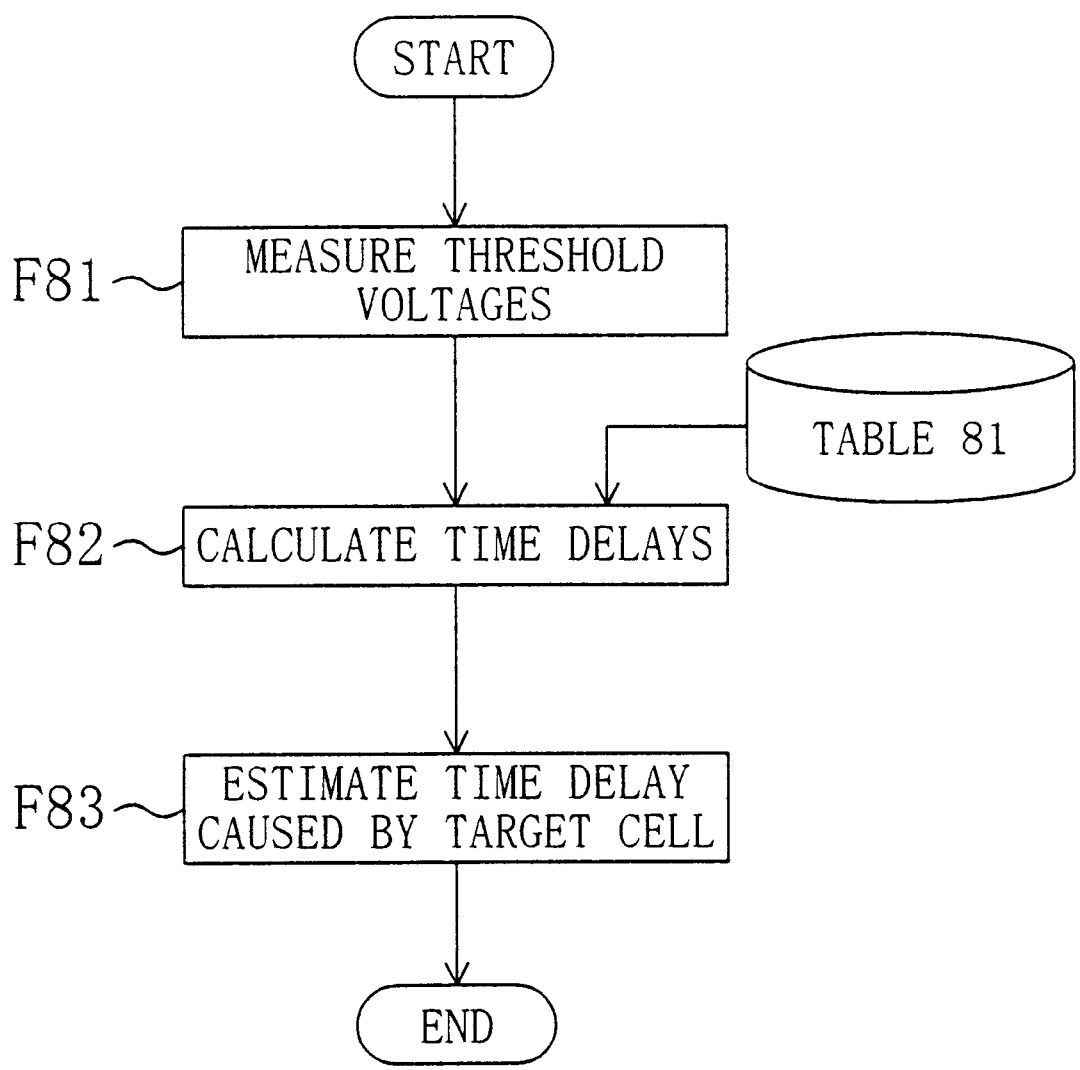
FIG. 9 is a flowchart illustrating respective processing steps of a delay estimating method according to a fourth embodiment of the present invention.

Hereinafter, the delay estimating method of the fourth embodiment will be described with reference to FIGS. 9 and 10. FIG. 9 is a flowchart illustrating respective processing steps of the delay estimating method of the fourth embodiment.

First, in Step F81, the threshold voltages vc11, vc21, vc12 and vc22 are measured by a DC test. As described above, the threshold voltages vc11 and vc21 have been normalized with the supply voltage Vdd1 applied to the input terminals of the representative and target cell, respectively. On the other hand, the threshold voltages vc12 and vc22 have been normalized with the supply voltage Vdd2 applied to the input terminals of the representative and target cells, respectively.

Next, in Step F82, a ratio D of the time delay T902 caused by the representative cell at the supply voltage Vdd2 to the time delay T901 caused by the same cell at the supply voltage Vdd1 is given by the following Equation (10):

$$D = T902/T901 \qquad (10)$$

Next, by reference to Table 81, i.e., a delay table for the target cell to which the supply voltage Vdd1 is applied, the time delay T903, corresponding to the transition time S1 and a load capacitance C1, is calculated. Then, the time h1 is obtained by multiplying the difference between the threshold voltages vc11 and vc21 by the transition time S1 of the input signal as represented by the following Equation (11):

$$h1 = S1 \times (vc11 - vc21) \qquad (11)$$

Subsequently, the time delay T904 is obtained by adding the time h1 to the time delay T903 as represented by the following Equation (12):

$$T904 = T903 + h1 \qquad (12)$$

And the time delay T905 is estimated by multiplying the time delay T904 by the ratio D as represented by the following Equation (13):

$$T905 = T904 \times D \qquad (13)$$

In Equation (12), by adding the time h1 to the time delay T903, the time delay T904 is converted into a time delay corresponding to a situation where the output signal waveform starts to change at the threshold voltage vc11. In other words, the time delay T904 to be multiplied by the ratio D is regarded as the time delay caused by the representative cell.

Next, in Step F83, the time h2 is obtained by multiplying the difference between the threshold voltages vc12 and vc22 by the transition time S1 of the input signal as represented by the following Equation (14):

$$h2 = S1 \times (vc22 - vc12) \qquad (14)$$

Subsequently, the time delay T906 caused by the target cell where the target supply voltage Vdd2 is applied thereto is obtained by adding the time h2 as a correction value to the time delay T905 as represented by the following Equation (15):

$$T906 = T905 + h2 \qquad (15)$$

By adding the variation in time delay, changing with the threshold voltage, to a value multiplied by a coefficient, a time delay caused by the target cell can be estimated very accurately with its supply voltage dependence fully taken into account for each cell or input terminal.

EMBODIMENT 5

FIG. 11 is a flowchart illustrating respective processing steps of a delay estimating method according to a fifth embodiment of the present invention. In the following description, a "cell" will refer to a logic element such as inverter or buffer, while an "instance" will be used as a label for identifying one of the cells executing the same logic from the others. The fifth embodiment relates to a method of estimating time delays, caused by respective instances, using a single delay table corresponding to just one supply voltage, where mutually different supply voltages are applied to those instances.

In FIG. 11, delay tables 150 are provided for various types of cells to which a supply voltage V1 is applied. The time delays estimated for respective instances, which make up a semiconductor integrated circuit, where the supply voltage V1 is applied thereto are stored on a file 151. The interpolation functions, derived for the respective instances, are stored on a file 152. If mutually different supply voltages are applied to the instances, those supply voltages are stored on a file 153. The time delays, obtained by substituting the supply voltages stored on the file 153 into the interpolation functions stored on the file 152, are stored on a file 154.

Figure 12:
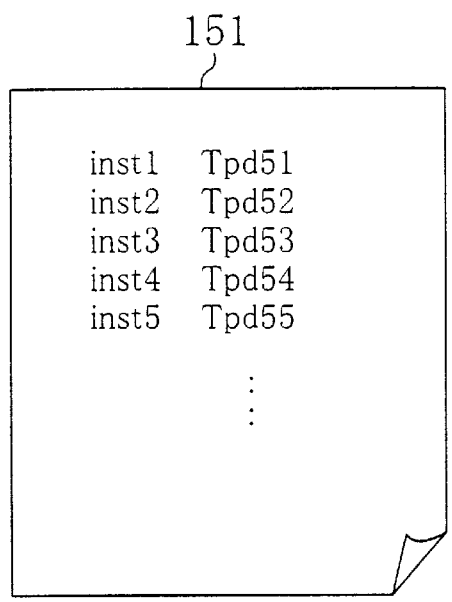
FIG. 12 illustrates a file on which time delays, obtained for respective instances, are stored in the fifth embodiment.

FIG. 12 illustrates the contents of the file 151. As shown in FIG. 12, the instances inst1 through inst5 cause time delays Tpd51 through Tpd55, respectively.

Figure 13:
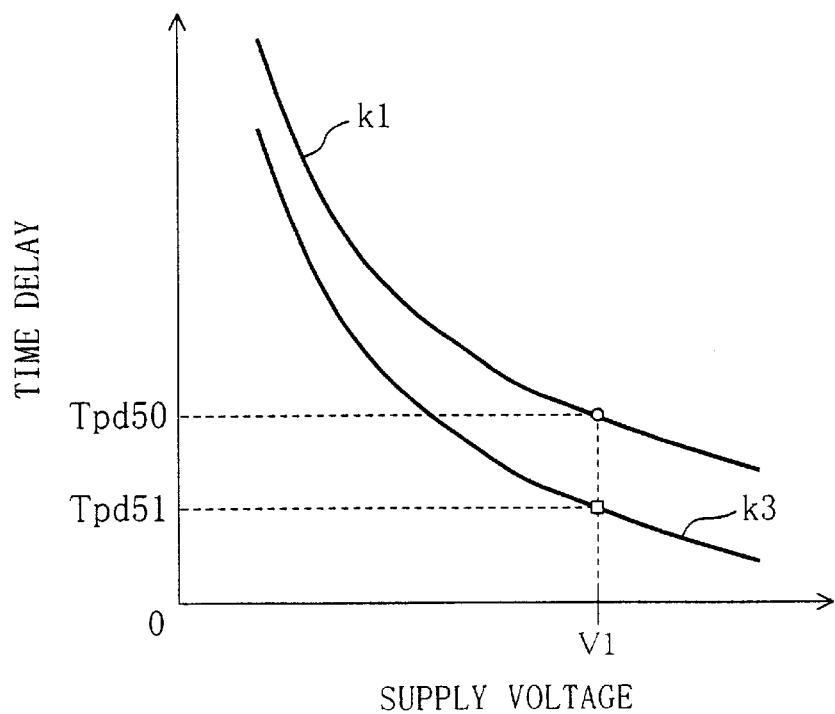
FIG. 13 is a graph illustrating approximation and interpolation functions, each representing a relation between time delays and supply voltages, in the fifth embodiment.

FIG. 13 illustrates approximation and interpolation functions, each representing a relation between the time delays and the supply voltages. In FIG. 13, Tpd50 is a time delay associated with the supply voltage V1 as represented by the approximation function k1. And k3 is an interpolation function for the instance inst1 that passes a point corresponding to the supply voltage V1 and the time delay Tpd51.

FIG. 14 illustrates the contents of the file 152. As shown in FIG. 14, interpolation functions g(Vdd, Tpd51) through g(Vdd, Tpd55) are stored on the file 152 for the in stances inst1 through inst55, respectively.

FIG. 15 illustrates the contents of the file 153. As shown in FIG. 15, supply voltages V001 through V005 are applied to the instances inst1 through inst5, respectively.

Figure 16:
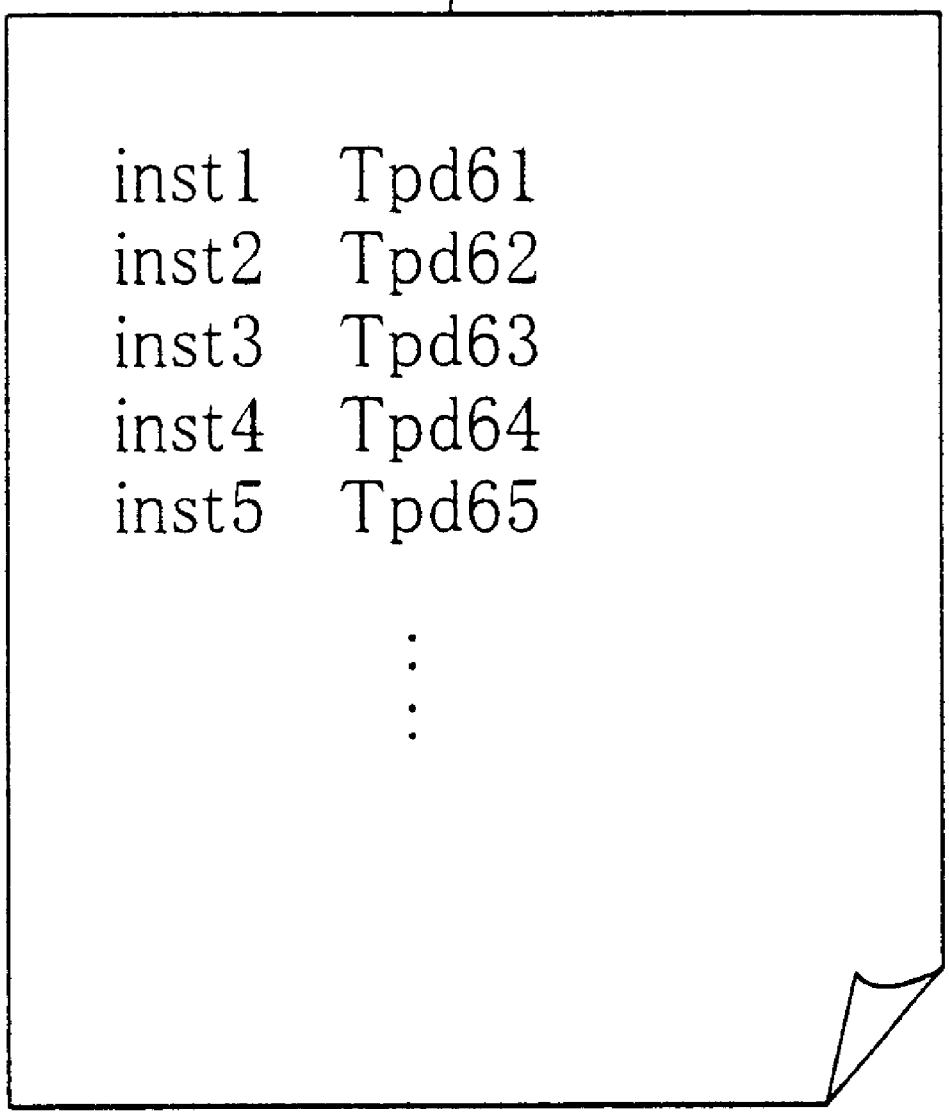
FIG. 16 illustrates a file on which time delays, estimated by using the supply voltages to be applied to respective instances, are stored in the fifth embodiment.

FIG. 16 illustrates the contents of the file 154. As shown in FIG. 16, Tpd61 through Tpd65 are time delays caused by the instances inst1 through inst5 where the supply voltages V001 through V005 are applied to the instances inst1 through inst5, respectively.

Hereinafter, a method of estimating a time delay according to the fifth embodiment will be described in detail with reference to FIGS. 11 through 16.

In FIG. 11, Step F1 is the same as the counterpart of the first embodiment, and the description thereof will be omitted herein. Next, in Step F42, the time delays caused by the respective instances for various transition times S of input signal waveforms and various load capacitances C are obtained by interpolation using the delay tables 150 associated with the supply voltage V1. In the illustrated embodiment, the time delays caused by all of the instances included in the semiconductor integrated circuit are calculated. For example, where the circuit is made up of the five instances inst1 through inst5, the time delays Tpd51 through Tpd55 are obtained as shown in FIG. 12.

Next, in Step F22, interpolation functions, corresponding to the time delays calculated for the respective instances in Step F42, are derived. For example, the interpolation function g(Vdd, Tpd51) may be derived by the following Equation (16):

$$g(Vdd, Tpd51)=f(Vdd)+E1 \quad (16)$$

where f(Vdd) is the approximation function and E1 is a coefficient. The coefficient E1 should be such a value as making the resultant time delay equal to Tpd51 where the supply voltage V1 is substituted into the approximation function f(Vdd). Thus, the coefficient E1 is given by the following Equation (17):

$$E1=Tpd51-Tpd50 \quad (17)$$

The interpolation functions for the other instances may be calculated in a similar manner.

Thereafter, in Step F32, the supply voltages applied to the respective instances are substituted into the interpolation functions derived for those instances in Step F22 to estimate the time delays caused by the instances for the transition times S and load capacitances C. As for the instance inst1, for example, the supply voltage V001 is substituted into the interpolation function g(Vdd, Tpd51), thereby estimating the time delay caused by the instance inst1 where the supply voltage V001 is applied thereto.

By deriving an interpolation function from time delays caused by respective instances to which a single supply voltage is applied, the delays can also be estimated without compiling a delay table for a target supply voltage even if mutually different supply voltages are applied to the instances.

EMBODIMENT 6

Figure 17:
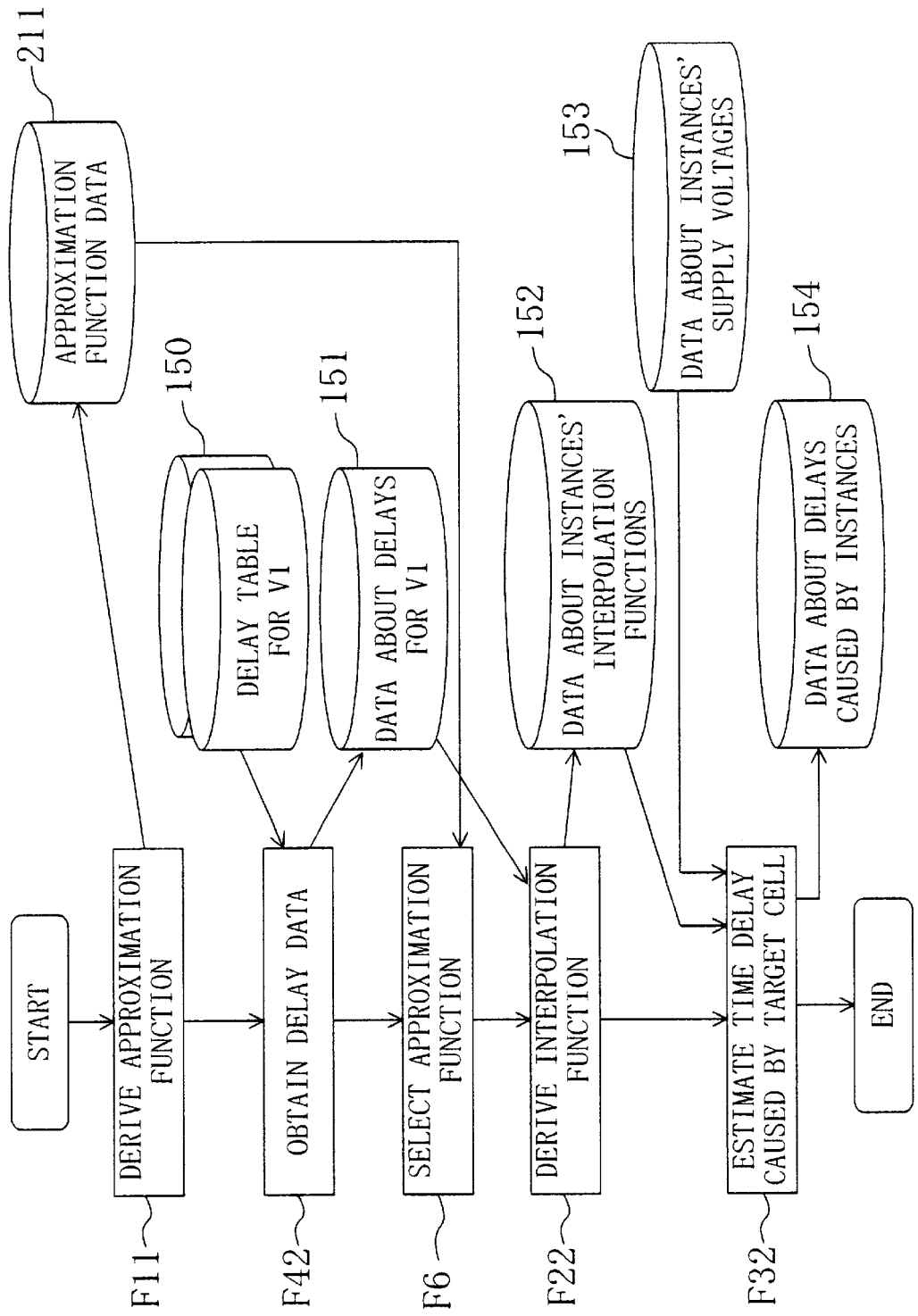
FIG. 17 is a flowchart illustrating respective processing steps of a delay estimating method according to a sixth embodiment of the present invention.

FIG. 17 is a flowchart illustrating respective processing steps of a delay estimating method according to a sixth embodiment of the present invention. The method of the sixth embodiment is a modification to that of the fifth embodiment.

In FIG. 17, approximation functions, which have been derived for respective representative cells of multiple groups, are stored on a file 211. In this case, the cells included in a semiconductor integrated circuit are classified according to their circuit structures into those groups and a representative cell is selected from each of the groups.

Figure 18:
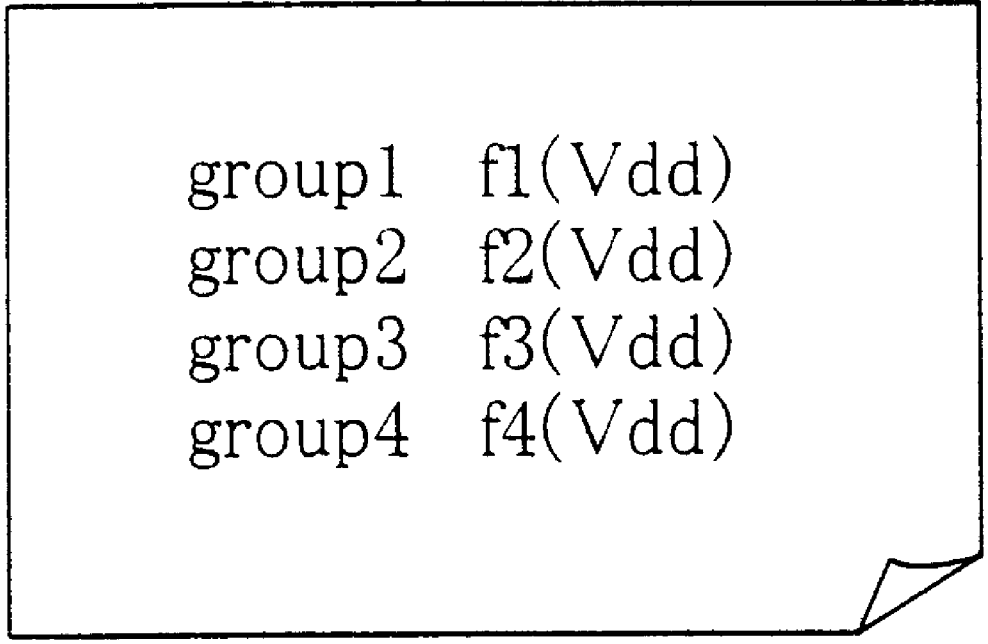
FIG. 18 illustrates a file on which approximation functions for respective groups are stored in the sixth embodiment.
Figure 19:
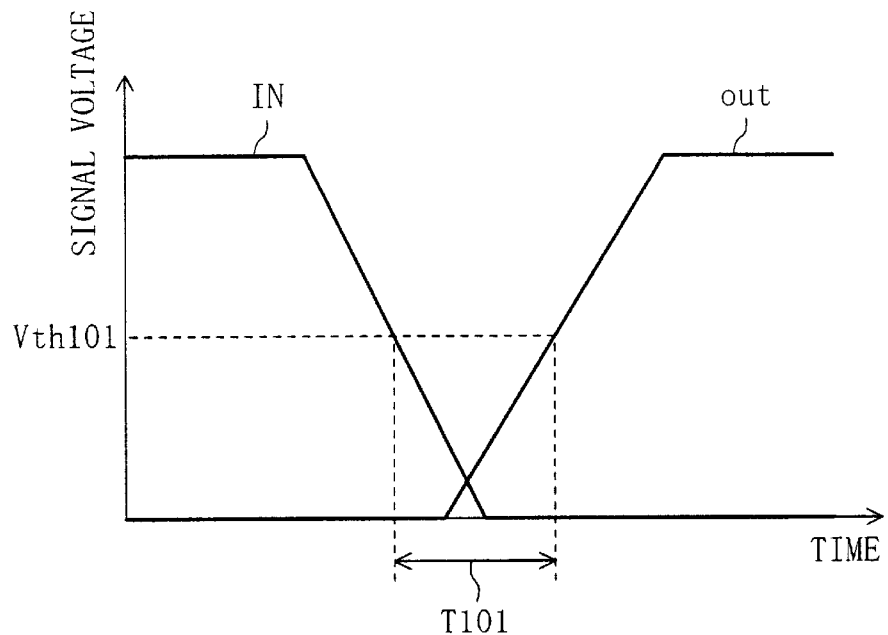
FIG. 19 is a graph illustrating a relation between input and output signal waveforms and a resultant time delay.
Figure 20:
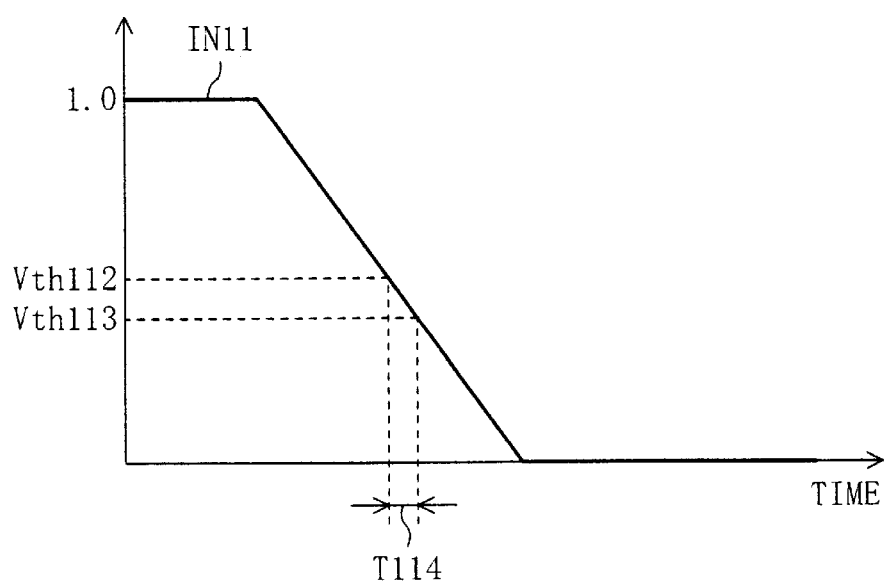
FIG. 20 is a graph illustrating how time delay is affected by a variation in threshold voltage with supply voltage.
Figure 21:
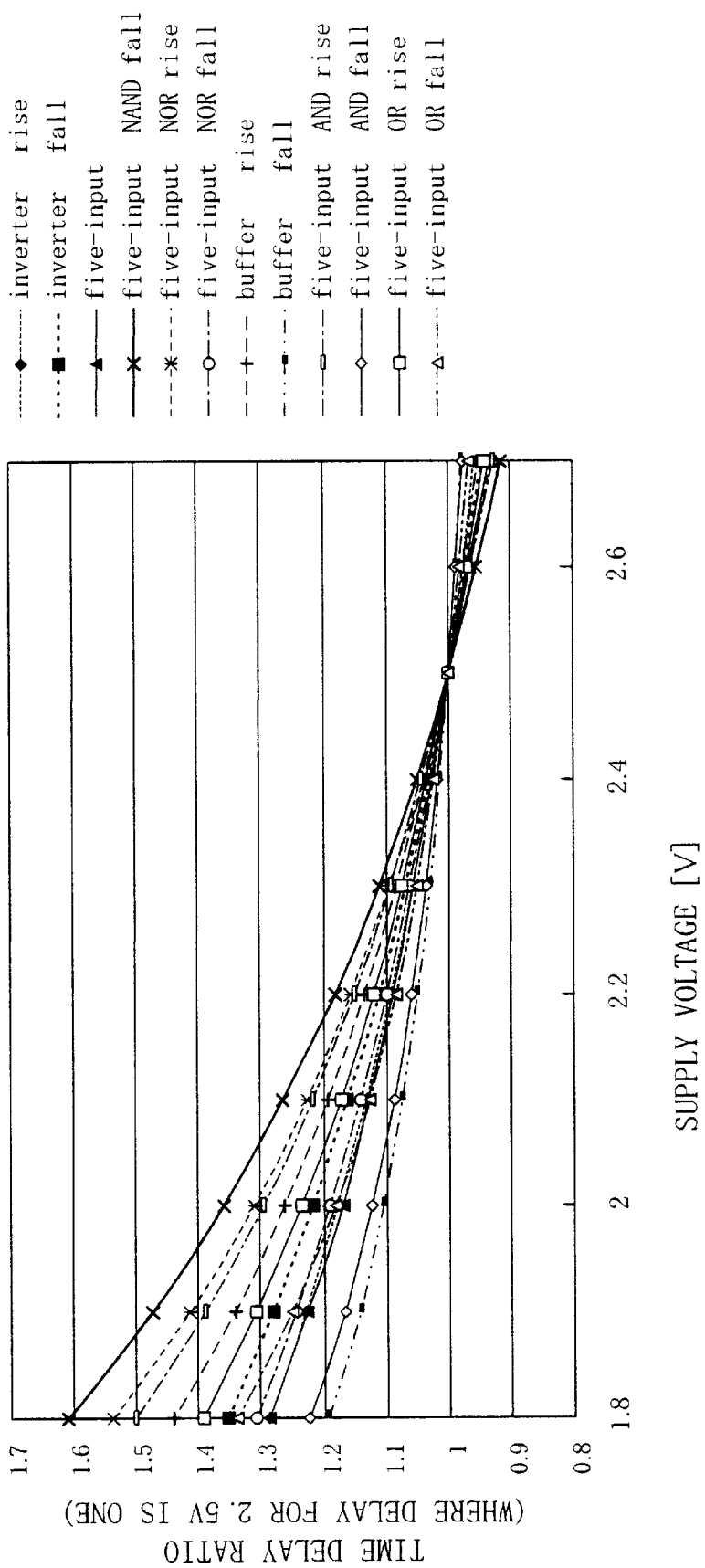
FIG. 21 is a graph illustrating respective ratios of time delays, resulting from various supply voltages applied to five types of cells, to a reference time delay.
Figure 22:
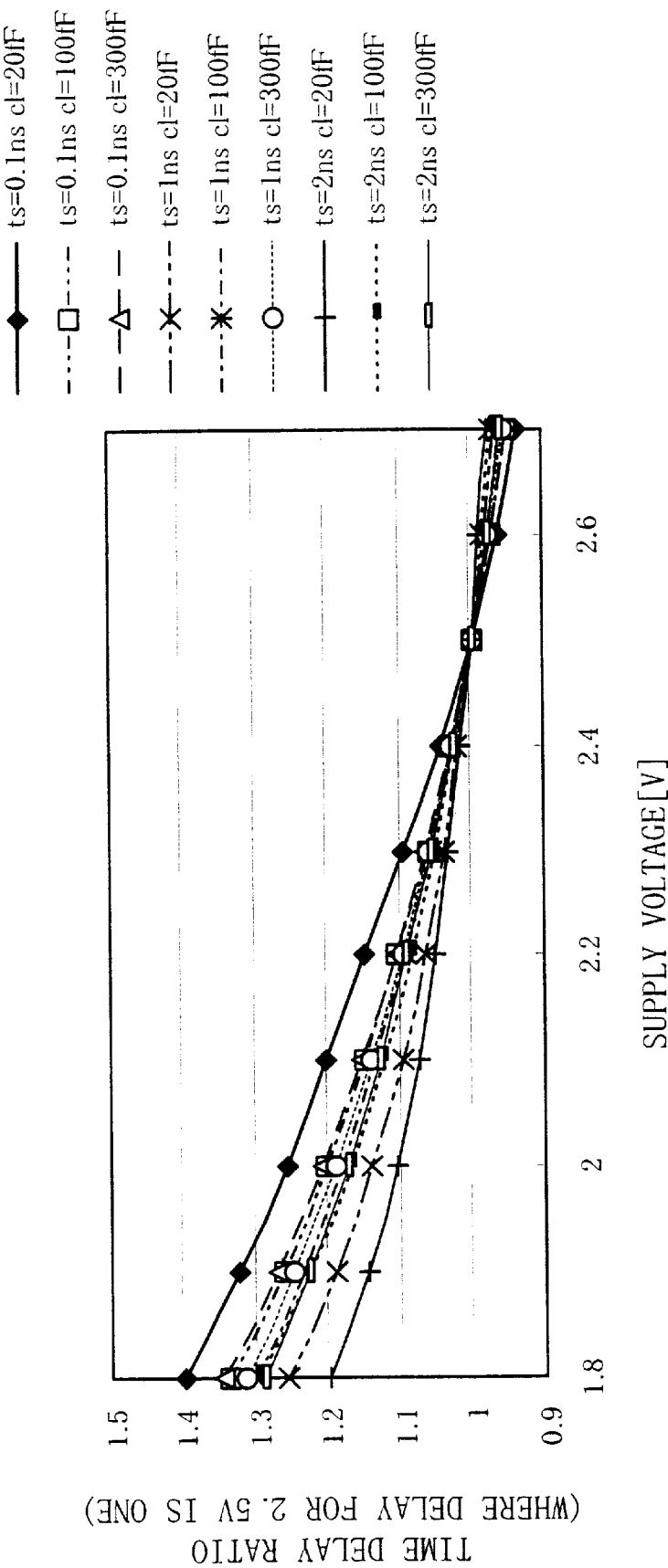
FIG. 22 is a graph illustrating respective ratios of time delays, caused by a single cell at various transition times of an input signal wave and various output load capacitances, to a reference time delay.

FIG. 18 illustrates the contents of the file 211. As shown in FIG. 18, the cells have been classified according to their circuit structures into groups 1 through 4. Also, approximation functions f1(Vdd) through f4(Vdd) have been derived for the respective groups 1 through 4.

Next, a delay estimating method according to the sixth embodiment will be described with reference to FIG. 17. The details of Step F11 according to the sixth embodiment illustrated in FIG. 17 is different from those of Step F1 according to the fifth embodiment illustrated in FIG. 11. Also, the method of the sixth embodiment further includes an additional step F6. Thus, only these differences will be described briefly.

First, in Step F11, the cells are classified into multiple groups according to their circuit structures, a representative cell is selected from each of the groups and the approximation function k1 is derived using the representative cell of each group.

Then, in Step F6, one of the approximation functions stored on the file 211, which is associated with the group to which a given instance belongs, is selected. For example, if the given instance inst1 belongs to group 2, then the approximation function to be used in Step F22 will be f2(Vdd).

In the sixth embodiment, approximation functions are derived for respective groups that have been formed by classifying the cells according to their circuit structures. Thus, a time delay caused by a target cell where a target supply voltage is applied thereto can be estimated accurately from time delays associated with a single supply voltage applied.

What is claimed is:

1. A method of estimating a time delay caused by one of multiple cells, including logic elements, in a semiconductor integrated circuit, the method comprising the steps:

a) deriving an approximation function by performing the sub-steps of:
        i) reading out time delays, which correspond to various supply voltages to be applied to a representative one of the cells and which have been obtained in advance through circuit simulations or actual measurement, and
        ii) representing a relation between the time delays and the supply voltages applied to the representative cell as the approximation function;

b) deriving an interpolation function by performing the sub-steps of:
        i) consulting first and second delay tables, which were prepared in advance for first and second ones of the supply voltages, as to a target one of the cells for which a time delay associated with a target one of the supply voltages should be obtained, and
        ii) representing a relation between the time delays of the target cell and the supply voltages as the interpolation function by reference to the time delays described on the first and second delay tables and the approximation function;

c) compiling a third delay table for a combination of transition times of an input signal wave and output load capacitances in accordance with the interpolation function, the combination being associated with a situation where the target supply voltage is applied to the target cell; and d) estimating the time delay to be caused by the target cell at the target supply voltage by searching the third delay table for one of the transition times and one of the output load capacitances that are associated with the target cell.

2. The method of claim 1, wherein in the step of deriving the approximation function, mutually different approximation functions are derived for rise and fall of an output signal of the representative cell.

3. The method of claim 1, wherein in the step of deriving the interpolation function, the interpolation function g(Vdd) is defined as:

$$g(Vdd)=f(Vdd)*A+B$$

where f(Vdd) is the approximation function and A and B are first and second constants, respectively, and wherein the first and second constants A and B are set to such values as making the interpolation function g(Vdd) equal to a time delay T1 at the first supply voltage and equal to a time delay T2 at the second supply voltage, respectively.

4. The method of claim 1, further comprising the step of selecting, if delay tables corresponding to at least three of the supply voltages have been prepared, two of the tables, corresponding to two of the voltages that are closest to the target voltage, as the tables for use in the step of deriving the interpolation function.

5. A method of estimating a time delay caused by one of multiple cells, including logic elements, in a semiconductor integrated circuit, the method comprising the steps of:

a) deriving an approximation function by performing the sub-steps of:
   i) reading out time delays, which correspond to various supply voltages to be applied to a representative one of the cells and which have been obtained in advance through circuit simulations or actual measurement, and
   ii) representing a relation between the time delays and the supply voltages applied to the representative cell as the approximation function;

b) compiling third and fourth delay tables from first and second tables read out,
   where the first table describes time delays, caused by a target one of the cells, for which a time delay associated with a target one of the supply voltages should be obtained, using a first combination of transition times of an input signal wave and load capacitances in a situation where a first one of the supply voltages is applied to the target cell, and
   where the second table describes the time delays, caused by the target cell, using a second combination of transition times of the input signal wave and load capacitances in a situation where a second one of the supply voltages is applied to the target cell, and
   where the third and fourth tables describe the time delays caused by the target cell using a third combination, which has been obtained by combining the first and second combinations together, in situations where the first and second supply voltages are applied to the target cell, respectively;

c) deriving an interpolation function as a relation between the time delays caused by the target cell and the supply voltages by reference to the time delays described on the third and fourth delay tables and the approximation function;

d) compiling a fifth delay table for the third combination of transition times of the input signal wave and output load capacitances in accordance with the interpolation function, the third combination being associated with a situation where the target supply-voltage is applied to the target cell; and e) estimating the time delay to be caused by the target cell at the target supply voltage by searching the fifth delay table for one of the transition times and one of the output load capacitances that are associated with the target cell.

6. The method of claim 5, wherein in the step b), the third combination is obtained by deriving a logical sum of the first and second combinations.

7. The method of claim 6, wherein in the step of deriving the approximation function, mutually different approximation functions are derived for rise and fall of an output signal of the representative cell.

8. The method of claim 6, wherein in the step of deriving the interpolation function, the interpolation function g(Vdd) is defined as:

$$g(Vdd)=f(Vdd)*A+B$$

where f(Vdd) is the approximation function and A and B are first and second constants, respectively, and wherein the first and second constants A and B are set to such values as making the interpolation function g(Vdd) equal to a time delay T1 at the first supply voltage and equal to a time delay T2 at the second supply voltage, respectively.

9. The method of claim 6, further comprising the step of selecting, if delay tables corresponding to at least three of the supply voltages have been prepared, two of the tables, corresponding to two of the voltages that are closest to the target voltage, as the tables for use in the step of deriving the interpolation function.

10. The method of claim 5, wherein in the step b), the third combination is obtained by performing linear interpolation on the first and second combinations.

11. The method of claim 10, wherein in the step of deriving the approximation function, mutually different approximation functions are derived for rise and fall of an output signal of the representative cell.

12. The method of claim 10, wherein in the step of deriving the interpolation function, the interpolation function g(Vdd) is defined as:

$$g(Vdd)=f(Vdd)*A+B$$

where f(Vdd) is the approximation function and A and B are first and second constants, respectively, and wherein the first and second constants A and B are set to such values as making the interpolation function g(Vdd) equal to a time delay T1 at the first supply voltage and equal to a time delay T2 at the second supply voltage, respectively.

13. The method of claim 10, further comprising the step of selecting, if delay tables corresponding to at least three of the supply voltages have been prepared, two of the tables, corresponding to two of the voltages that are closest to the target voltage, as the tables for use in the step of deriving the interpolation function.

14. The method of claim 5, wherein in the step of deriving the approximation function, mutually different approximation functions are derived for rise and fall of an output signal of the representative cell.

15. The method of claim 5, wherein in the step of deriving the interpolation function, the interpolation function g(Vdd) is defined as:

$$g(Vdd)=f(Vdd)*A+B$$

where f(Vdd) is the approximation function and A and B are first and second constants, respectively, and wherein the first and second constants A and B are set to such values as making the interpolation function g(Vdd) equal to a time delay T1 at the first supply voltage and equal to a time delay T2 at the second supply voltage, respectively.

16. The method of claim 5, further comprising the step of selecting, if delay tables corresponding to at least three of the supply voltages have been prepared, two of the tables, corresponding to two of the voltages that are closest to the target voltage, as the tables for use in the step of deriving the interpolation function.

17. A method of estimating a time delay caused by one of multiple cells, including logic elements, in a semiconductor integrated circuit, the method comprising the steps:

a) deriving an approximation function by performing the sub-steps of:
   i) reading out time delays, which correspond to various supply voltages to be applied to a representative one of the cells and which have been obtained in advance through circuit simulations or actual measurement, and
   ii) representing a relation between the time delays and the supply voltages applied to the representative cell as the approximation function;

b) calculating first and second time delays that will be caused by a target one of the cells, for which a time delay associated with a target one of the supply voltages should be obtained, in situations where first and second ones of the supply voltages are applied to the target cell, respectively;

c) deriving an interpolation function as a relation between the time delays of the target cell and the supply voltages by reference to the approximation function and the first and second time delays; and d) estimating the time delay to be caused by the target cell at the target supply voltage in accordance with the interpolation function.

18. A method of estimating a time delay caused by one of multiple cells, including logic elements, in a semiconductor integrated circuit, the method comprising the steps:

a) deriving an approximation function by performing the sub-steps of:
   i) reading out time delays, which correspond to various supply voltages to be applied to a representative one of the cells and which have been obtained in advance through circuit simulations or actual measurement, and
   ii) representing a relation between the time delays and the supply voltages applied to the representative cell as the approximation function;

b) obtaining delay data of respective instances, which make up the circuit, for the first supply voltage by reading out delay tables for the first supply voltage and calculating respective time delays, which will be caused by the instances, using the delay tables;

c) deriving an interpolation function for each said instance by reading out the approximation function and adding a constant, which is defined by reference to the delay data of the instances for the first supply voltage, to the approximation function; and d) reading out data, representing the interpolation functions of the instances and the supply voltages applied to the instances, and estimating a time delay caused by each said instance in accordance with associated one of the interpolation functions in a situation where the supply voltage as represented by the data is applied to the instance.

19. The method of claim 18, wherein in the step a), the cells are classified into a plurality of groups according to circuit structures of the cells, the representative cell is selected from each of the groups and the approximation function is derived for each said representative cell, and wherein the method further comprises the step of selecting one of the approximation functions of the respective representative cells, which is associated with one of the groups where the instances causing the time delay calculated in the step b) belong, and reading out the approximation function in the step c).

* * * * *